United States Patent
Gravermann et al.

(10) Patent No.: US 10,215,778 B2
(45) Date of Patent: *Feb. 26, 2019

(54) VOLTAGE SENSOR

(71) Applicant: 3M INNOVATIVE PROPERTIES COMPANY, St. Paul, MN (US)

(72) Inventors: Mark Gravermann, Erkelenz (DE); Sebastian Eggert, Dusseldorf (DE); Michael Petry, Dinslaken (DE); Werner Roehling, Hueckelhoven (DE); Friedrich A. Busemann, Amelinghausen (DE); Bernd Schubert, Cologne (DE); Gerhard Lohmeier, Cologne (DE); Michael H. Stalder, Uedem (DE); Jens Weichold, Erkelenz (DE); Rainer Reeken, Dormagen (DE); Andreea Sabo, Dusseldorf (DE); Christian Weinmann, Alsdorf (DE); Dipankar Ghosh, Oakdale, MN (US); Myungchan Kang, Woodbury, MN (US); Christopher D. Sebesta, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 159 days.

This patent is subject to a terminal disclaimer.

(21) Appl. No.: 15/106,591

(22) PCT Filed: Dec. 16, 2014

(86) PCT No.: PCT/US2014/070530
§ 371 (c)(1),
(2) Date: Jun. 20, 2016

(87) PCT Pub. No.: WO2015/095150
PCT Pub. Date: Jun. 25, 2015

(65) Prior Publication Data
US 2017/0030946 A1 Feb. 2, 2017

(30) Foreign Application Priority Data

Dec. 18, 2013 (EP) .................................. 13198139

(51) Int. Cl.
*G01R 15/16* (2006.01)
*G01R 19/00* (2006.01)
(Continued)

(52) U.S. Cl.
CPC ........... *G01R 15/16* (2013.01); *G01R 15/142* (2013.01); *G01R 19/0084* (2013.01); *G01R 15/181* (2013.01)

(58) Field of Classification Search
CPC .... G01R 19/0084; G01R 15/16; G01R 15/06; G01R 15/181; G01R 15/142;
(Continued)

(56) References Cited

U.S. PATENT DOCUMENTS 4,090,130 A * 5/1978 Willenbecher, Jr. .... F02P 17/12
324/126
4,963,819 A * 10/1990 Clarke .................... G01R 15/16
174/73.1
(Continued)

FOREIGN PATENT DOCUMENTS

CN 102543427 7/2012
DE 4125856 9/1992
(Continued)

OTHER PUBLICATIONS

International Search Report for PCT International Application No. PCT/US2014/070530 dated Mar. 3, 2015, 3 pages.

*Primary Examiner* — Lee Rodak
(74) *Attorney, Agent, or Firm* — Gregg H. Rosenblatt

(57) ABSTRACT

Voltage sensor (1) for a high- or medium-voltage power-carrying conductor for a power network, such as an inner conductor of a power cable or a cable connector or a bus bar.

(Continued)

Figure 1:
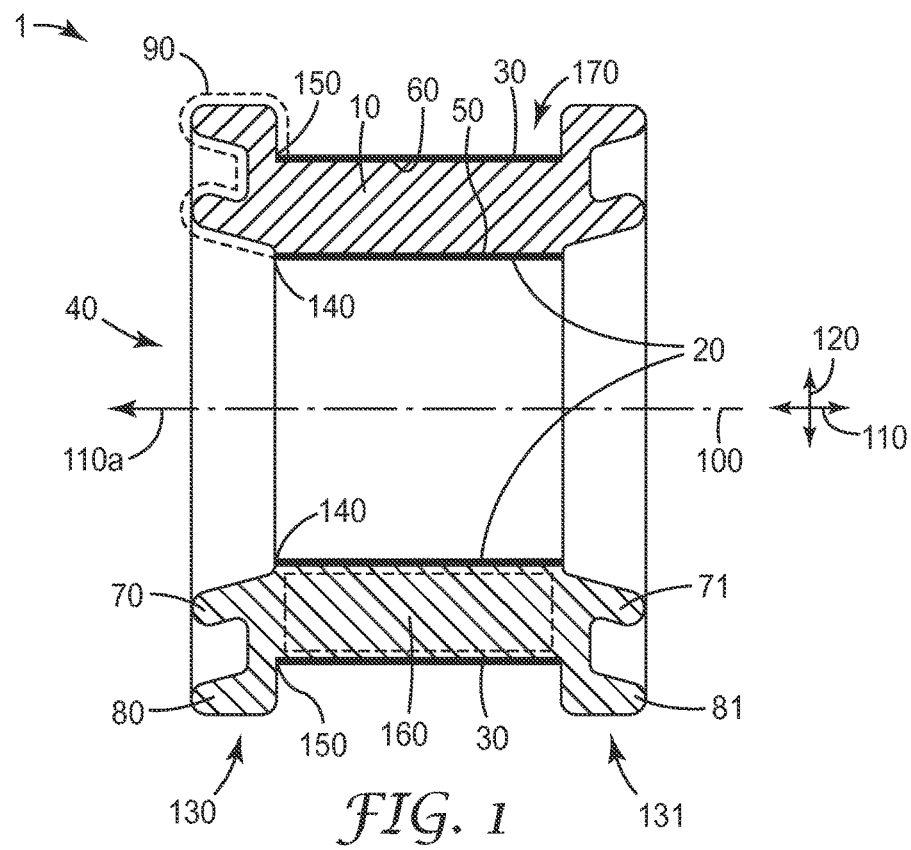

The voltage sensor has a tubular shape and an axial passageway (40), which can receive the conductor. The voltage sensing device comprises a) a radially-inner electrode (20), operable as a first sensing electrode of a sensing capacitor for sensing the voltage of the power-carrying conductor, b) a radially-outer electrode (30), operable as a second sensing electrode of the sensing capacitor, and c) a solid carrier element (10), at least a first portion of which is arranged between the inner electrode and the outer electrode, the first portion being operable as a dielectric of the sensing capacitor. The sensor can be accommodated in a cable accessory. The carrier element may comprise ceramic material to increase accuracy.

17 Claims, 9 Drawing Sheets

(51) Int. Cl.
*G01R 15/14* (2006.01)
*G01R 15/18* (2006.01)

(58) Field of Classification Search
CPC .. G01R 15/146; G01R 15/202; G01R 15/247; G01R 27/26; G01R 27/2605; G01R 31/021; G01R 31/1272; G01R 31/1245; G01R 31/1254; G01R 19/0023; G01R 19/0046; G01R 19/0092; G01R 19/155; G01R 1/06; G01R 1/22; H01B 9/006; H01B 13/06; H01B 13/22; H01B 13/6683; H01B 13/53; H01B 13/5845; H01R 43/26
USPC .......................................... 324/126, 72.5, 72
See application file for complete search history.

(56) References Cited

U.S. PATENT DOCUMENTS

| | | | | |
|---|---|---|---|---|
| 5,053,915 A | * | 10/1991 | Dupraz | G01R 15/16 361/281 |
| 5,323,117 A | * | 6/1994 | Endoh | G01R 31/021 324/541 |
| 5,400,210 A | * | 3/1995 | Sugimoto | H01G 4/08 361/321.5 |
| 5,473,244 A | * | 12/1995 | Libove | G01R 1/22 324/126 |
| 6,127,817 A | | 10/2000 | Chartrefou | |
| 6,313,635 B1 | | 11/2001 | Noll | |
| 6,489,782 B1 | | 12/2002 | Baier | |
| 7,397,233 B2 | * | 7/2008 | Sorensen | G01R 15/16 324/129 |
| 2001/0048308 A1 | | 12/2001 | Potter | |
| 2005/0275397 A1 | * | 12/2005 | Lightbody | G01R 15/142 324/126 |
| 2006/0202671 A1 | | 9/2006 | Mulligan | |
| 2006/0258327 A1 | * | 11/2006 | Lee | H01G 4/206 455/352 |
| 2007/0087929 A1 | * | 4/2007 | Park | H01G 4/206 501/100 |
| 2010/0156441 A1 | | 6/2010 | Moliton | |
| 2011/0148393 A1 | * | 6/2011 | de Buda | G01R 15/06 324/76.11 |
| 2012/0189895 A1 | | 7/2012 | Gutsch | |
| 2013/0107421 A1 | * | 5/2013 | Zenzai | H01G 4/12 361/321.1 |
| 2014/0021965 A1 | * | 1/2014 | De Rybel | G01R 15/16 324/632 |

FOREIGN PATENT DOCUMENTS

| | | |
|---|---|---|
| EP | 0172634 | 2/1986 |
| EP | 0716474 | 6/1996 |
| EP | 2508896 | 10/2012 |
| GB | 1058890 | 2/1967 |
| JP | 2009-103608 | 5/2009 |
| KR | 20-0252652 | 10/2001 |
| WO | WO 2001-94956 | 12/2001 |
| WO | WO 2007-130811 | 11/2007 |
| WO | WO 2009-139521 | 11/2009 |
| WO | WO 2012-130816 | 10/2012 |
| WO | WO 2013-096354 | 6/2013 |
| WO | WO 2013-096424 | 6/2013 |
| WO | WO 2014-205170 | 12/2014 |

\* cited by examiner

VOLTAGE SENSOR

The invention relates to sensors for high or medium voltages in power networks. In particular, it relates to sensors for sensing voltages in high-voltage or medium voltage power carrying conductors, such as power cables in power distribution networks like in national grids. The invention also relates to cable connectors that can be used with the sensors, to cable accessories that comprise the sensors, and to combinations of the sensors with cable connectors or with power cables. The invention also relates to methods of arranging a voltage sensor on cable connectors.

Operators of electrical power networks monitor the state of their networks using sensors for voltage and current on their installations and on individual cables. An example of a voltage sensor for high-voltage and medium-voltage power cables is described in the British patent GB1058890, in which the insulated conductor of the cable and a field-sensing probe electrode are surrounded by a guard electrode, and in which the guard and probe electrodes are connected to the input terminals of a high-gain amplifier.

Capacitive voltage sensors are particularly suitable for high-voltage applications, because they allow to avoid galvanic coupling between the inner conductor of the cable, or a connector connected to that inner conductor, and elements of the sensor. The European patent application EP 0882989 A1 describes a high-voltage capacitive sensor in which an isolating compartment is made up of a homogeneous dielectric such as glass or vitreous ceramic. The isolating section thickness determines the division factor of the voltage divider.

A voltage sensor should advantageously be small. A small size may allow a sensor to be placed inside a cable accessory, e.g. inside a cable termination, inside a separable connector, or inside a cable splice. A sensor placed inside a cable accessory is protected against environmental impact by an outer shell of the accessory. The Chinese unexamined patent application CN 102543427 shows an annular capacitor with a ceramic dielectric and a middle through hole. However, the staggered arrangement of the electrodes is not particularly space-saving. The European patent application EP 0 172 634 A1 talks about a high-voltage capacitor suitable for measuring the voltage of an overhead power line. The capacitor dielectric is mounted directly onto the power line conductor, which serves as one electrode of the capacitor. The sensor, however, appears way too large to fit into a typical cable accessory.

In particular, a sensor should have a shape that allows a power-carrying conductor, such as a cable or a cable connector, combined with the sensor, to have a small diameter with respect to the conductor. A small diameter may generally be beneficial, e.g. when the combination of the conductor and the sensor is to be accommodated in a cable accessory, as described above, but also when a cable is to be connected to a bushing of a switchgear, because bushings on a switchgear are placed at a certain distance from each other. If, for example, the diameter of a first power cable, in combination with the sensor, is large, a second cable may not be connectable to an adjacent bushing any more due to lack of space.

In order to avoid electric breakdown and discharge between elements of a sensor on electrical ground and other elements on high or medium voltage, known sensors employ relatively thick layers of electrically isolating material. Known sensors use a thick layer of dielectric between the electrodes of a sensing capacitor. For this reason, many known capacitive voltage sensors are too large to fit within a cable accessory. In particular, they are too large to be retro-fittable within most existing cable accessories.

The present invention seeks to address this problem. It provides a voltage sensing device for a high-voltage or medium-voltage power-carrying conductor for a power network, such as an inner conductor of a power cable or a cable connector or a bus bar, the voltage sensing device having a tubular shape and an axial passageway defining axial and radial directions, which passageway can receive the power-carrying conductor, the voltage sensing device comprising
a) a radially-inner electrode, operable as a first sensing electrode of a sensing capacitor for sensing the voltage of the power-carrying conductor,
b) a radially-outer electrode, operable as a second sensing electrode of the sensing capacitor,
c) a solid carrier element, at least a first portion of which is arranged between the inner electrode and the outer electrode, the first portion being operable as a dielectric of the sensing capacitor.

A voltage sensing device according to the invention has a tubular shape and comprises a radially-inner ("inner") and a radially-outer ("outer") electrode, and an axial passageway. The passageway can receive a power-carrying conductor such as an inner conductor of a power cable or a cable connector. This may constitute a space-saving arrangement of the elements of the sensor, so that the sensor is small enough to be arranged in a cable accessory. The voltage sensing device may comprise two or more shells, engageable with each other to form a voltage-sensing device having a tubular shape. This may allow the voltage sensing device to be arranged around a power-carrying conductor at a longer distance from an end of the power-carrying conductor.

In a high- or medium-voltage capacitive sensor, one electrode is normally on a high voltage, while the other electrode is on a low voltage or on electrical ground. It is important to electrically isolate the high-voltage electrode from the low-voltage electrode well enough to avoid electrical breakdown between the electrodes. Such a breakdown between the electrodes can occur through the material arranged between the electrodes, i.e. through the dielectric of the sensing capacitor. A breakdown between the electrodes can also occur along a surface of the dielectric ("surface breakdown"). In particular for geometrically small sensors, it is a challenge to provide sufficient strength against surface breakdown, i.e. electrical breakdown between the electrodes along a surface. The present invention also attempts to address this problem. In one aspect, it provides a voltage sensing device as described above, wherein the inner electrode extends, in a first axial direction, up to an inner electrode edge, wherein the outer electrode extends, in the first axial direction, up to an outer electrode edge, and wherein the carrier element is shaped such that the geometrically shortest path along a surface of the carrier element between the outer electrode edge and the inner electrode edge has a length of at least 3 millimeters.

The carrier element being shaped such that the shortest surface breakdown path or surface discharge path between edges of the electrodes along the surface of the carrier element is 3 mm or longer provides increased surface breakdown strength and helps ensure a sufficient resistance against electrical breakdown along the surface of the carrier element. The risk of a surface breakdown is reduced, for medium- and high-voltage sensing, by the path length being 3 mm or more. Shorter path lengths have shown to result in an increased risk of surface breakdown under certain circumstances.

In order to keep the geometrical size of the sensor small, it is desirable to minimize the geometric radial distance between the inner electrode and the outer electrode, i.e. to minimize the thickness of the dielectric. However, the thickness must be sufficient to minimize the risk of an electrical breakdown between the electrodes through the dielectric. The present invention seeks to minimize the geometric size of the sensor while maintaining its resistance against electrical breakdown through the dielectric. To that end, in one aspect, the invention provides a voltage sensing device as described above, wherein the outer electrode has a curved profile, in an axial longitudinal sectional view of the voltage sensing device, such that a central portion of the outer electrode is radially closer to a central axis of the passageway than the outer electrode edge is.

A curved profile may be advantageous in order to reduce the risk of electrical breakdown between the inner electrode and the outer electrode. A curved profile of the outer electrode, as taken in an axial longitudinal section of the sensor, may operate as a geometrical stress control. The curved shape may reduce field concentration at an edge of the outer electrode. Thereby, the risk of breakdown between the electrodes through the dielectric is reduced. Applying this measure of curving the outer electrode profile may allow to reduce the spacing between the electrodes. This in turn may save space and may allow the sensor to be smaller in size.

In one specific embodiment, the curved profile may have a straight section and one or two or more curved sections, adjacent to the straight section. A curved section may be curved in a direction facing away from the central passageway.

Alternatively, the outer electrode may have a straight profile, in an axial longitudinal sectional view of the voltage sensing device, such that all portions of the outer electrode are radially equally close to a central axis of the passageway. A straight profile may be advantageous for keeping the overall size of the voltage sensing device small, and it may be particularly cost-effective to manufacture.

In the specific axial direction, the inner electrode extends up to an edge (the "outer electrode edge"). The inner electrode edge and the outer electrode edge may be arranged in the same axial position.

Depending on the load current through the power-carrying conductor, the temperature of the power-carrying conductor can be at ambient temperature or much higher. Some high-voltage cables are operated at temperatures of 80° C. or more. A sensor which is arranged close to the inner conductor of the cable, or which receives the inner conductor in its passageway, will follow the temperature variations of the cable, i.e. it will become cooler or warmer as the inner conductor becomes cooler or warmer. The sensor size, and in particular the radial distance between the inner electrode and the outer electrode, will thereby change, with changes in the temperature of the cable. This change in geometry results in a change of the capacitance of the sensing capacitor formed by the two electrodes and the dielectric, which in turn results in a variation in the sensor output. This temperature effect thereby leads to a loss in accuracy of the sensor. The present invention seeks to address this problem, too. In one aspect, the invention provides a voltage sensing device as described above, wherein the carrier element comprises a material which has a coefficient of thermal expansion of less than $5 \times 10^{-6}$ 1/K at 20° C., such as a ceramic material.

A carrier element comprising a material which has a low coefficient of thermal expansion, e.g. of less than $5 \times 10^{-6}$ 1/K at 20° C., and in particular a carrier element comprising ceramic material, reduces the impact of temperature on the geometry of the sensor and, thereby, on the output of the sensor. This is because the radial distance between the electrodes changes very little with temperature. The capacitance of the sensing capacitor therefore remains more stable with temperature variations. This results in the sensor thus providing a more accurate output.

Generally, an impact of temperature changes on the capacitance of the sensing capacitor can also be reduced by selecting materials for the carrier element which have a specific capacitance that varies little when temperature changes, i.e. materials which have a low temperature coefficient of capacitance.

In an aspect of the invention, the carrier element may comprise one or more material(s) selected from porcelain, mica, and silicon nitride. In other aspects, the carrier element may comprise "IEC/EN 60384 class 1" dielectric materials such as $MgNb_2O_6$, $ZnNb_2O_6$, $MgTa_2O_6$, $ZnTa_2O_6$, (Zn, Mg)$TiO_3$, (ZrSn)$TiO_4$, $CaZrO_3$, or $Ba_2Ti_9O_{20}$. IEC/EN 60384 class 1 refers to the classification of the International Electrotechnical Commission IEC, in IEC/EN 60384-1 and IEC/EN 60384-8/9/21/22. In particular, the material(s) may be selected from COG (NPO) ceramics.

In an aspect of the invention, the carrier element may comprise one or more material(s) selected from polymers having a temperature coefficient of capacitance below $20 \times 10^{-6}$ 1/K in the temperature range between +10° C. and +130° C., such as Polypropylene, Polyethylene Terepthalathe, Polyester, Polyimide, Polytetrafluoroethylene, Ethylene Chlorotrifluoroethylene, Polyoxymethylene, Polyphenyl Ethers, Polyethylenimine, Polymethylpentene, Cyclic Olefin Copolymer, Polysulfone, Polyetheretherketone, Polyphenylene Sulphide, or Polyethylene Naphthalate. In other aspects of the invention, the carrier element may comprise Polyphenylene Sulphide. In further aspects, the carrier element may comprise Polyethylene Naphthalate. Certain ones of these polymers, apart from their low temperature coefficients of capacitance, may offer high stability and reliability, high electric breakdown strength, self-healing properties and/or low dielectric loss.

In a further aspect of the invention, the carrier element may comprise a ceramic filler/polymer matrix composite. In other words, the carrier element may comprise a host polymer matrix which can be filled with ceramic fillers. Such ceramic fillers may be, for example, porcelain, mica, $Si_3N_4$, COG/NPO formulations based on (Mg,Zn) $TiO_3$, $Ba_2Ti_9O_{20}$, or $CaZrO_3$, or mixtures of these. The host polymer matrix may comprise a polymer, such as EPR, having a negative temperature coefficient of capacitance and the ceramic filler may comprise a material having a positive temperature coefficient of capacitance. Alternatively, the host polymer matrix may comprise a polymer having a positive temperature coefficient of capacitance and the ceramic filler may comprise a material having a negative temperature coefficient of capacitance. The overall ceramic filler/polymer matrix composite may thereby have a very low temperature coefficient of capacitance. A voltage sensing device having a carrier element comprising such a composite may sense the voltage of a power-carrying conductor at a higher accuracy than other devices.

Generally, and independent of what is described above, the carrier element may comprise a first ceramic material having a positive temperature coefficient of capacitance and a second ceramic material having a negative temperature coefficient of capacitance. The carrier element may comprise a first ceramic material having a positive temperature coefficient of capacitance and a second ceramic material having a negative temperature coefficient of capacitance at one specific temperature in the temperature range between 10° C. and 130° C. A voltage sensing device having such a carrier element may sense the voltage of a power-carrying conductor at a higher accuracy than other devices.

In order for the sensor to sense the voltage of the power-carrying conductor, an electrical connection between the power-carrying conductor and one of the sensor electrodes is required. Similarly, for the sensor to sense the voltage of a cable connector connected to the inner conductor, an electrical connection between the cable connector and one of the sensor electrodes is required. This electrical connection should ideally be mechanically reliable and should withstand mechanical forces that might stem from relative movement of the sensor with respect to the power-carrying conductor, e.g. with respect to the cable connector. It should also withstand mechanical forces that might originate from different thermal expansion of the sensor on the one hand, and of the power-carrying conductor on the other hand. Such a contact element should further take as little space as possible, so that the sensor can have a small size. The present invention seeks to address these requirements. It provides, in a further aspect, a voltage sensing device as described above, wherein the voltage sensing device comprises a conductive contact element, electrically connected to the inner or the outer electrode, and extending into the passageway, for mechanically and electrically contacting a power-carrying conductor received in the passageway.

Such a contact element may provide a particularly simple connection between the power-carrying conductor and the inner or outer electrode. In embodiments where the inner electrode is arranged in the passageway, the contact element may provide a very short electrical path between the power-carrying conductor and the inner electrode. A short electrical path may reduce ohmic losses and may increase the accuracy of the voltage sensor. Also, a conductive contact element extending into the passageway of the sensor may be a particularly space-saving means for providing an electrical connection between one of the electrodes and the power-carrying conductor, or, as the case may be, between one of the electrodes and a cable connector, received in the passageway of the sensor. The arrangement of the contact element such that it extends into the passageway may provide for a particularly easy, short and rugged electrical connection between one of the electrodes and the power-carrying conductor. The contact element may make the use of wires obsolete, that might otherwise be used to electrically connect one of the sensor electrodes with the power-carrying conductor such as an inner conductor of the cable or with a cable connector.

Generally, the conductive contact element may extend into the passageway. Independent of all other features, the contact element may comprise a resilient portion. When inserting the power-carrying conductor into the passageway, the resilient portion may provide for an automatic contact between the power-carrying conductor and the inner or outer electrode. A contact element having a resilient portion may also provide a sufficient contact pressure for a reliable mechanical and electrical contact between the conductor and the electrode. Resilience of the contact element or of a portion of it is further beneficial for reliably compensating for changes in the width of the gap between the inner electrode and the conductor, that arise with changes in temperature of the carrier element and the conductor. The same effect is achieved with a contact element that is resiliently supported.

The contact element may comprise elastomeric material. The elastomeric material may be electrically conductive or it may have an electrically conductive surface. The elastomeric material may be arranged on an outer surface of the cable connector or on a surface of the inner electrode, such that the conductive elastomeric material and/or its conductive surface provides an electrical connection between the power-carrying conductor on a surface of the inner electrode.

For the contact element to establish electrical contact between the inner or the outer electrode and the power-carrying conductor, the power-carrying conductor may have an exposed portion, in which a surface of the power-carrying conductor allows for establishing a mechanical and electrical contact between the contact element and the power-carrying conductor.

Generally, a voltage sensing device according to the present invention may be comprised in a capacitive voltage sensor assembly. The inner electrode, the outer electrode and the first portion of the carrier element are operable as a sensing capacitor. The sensing capacitor may therefore be comprised in the voltage sensor assembly. The voltage sensor assembly may further comprise a secondary capacitor. The sensing capacitor and the secondary capacitor may be connected in series such as to form a capacitive voltage divider. The capacitive voltage divider may be operable to sense a voltage of the power-carrying conductor, such as an inner conductor of the power cable or a cable connector.

The power-carrying conductor may be an inner conductor of a medium-voltage or high-voltage power cable. A high-voltage or medium-voltage power cable typically comprises a central inner conductor, a cable insulation arranged around and/or on the inner conductor, and a semiconductive layer arranged around and/or on the cable insulation. An insulating cable jacket often constitutes the outermost layer of the cable. The passageway of the voltage sensing device can receive a portion of the inner conductor. It can receive a portion of the bare inner conductor, i.e. a portion of the inner conductor not surrounded by other layers of the cable. A portion of the inner conductor received in the passageway may comprise an exposed surface portion of the inner conductor. Other surface portions may be covered with insulating material.

Independent of other features, in order for the passageway to receive a portion of the inner conductor, an end portion of the inner conductor may be pushed into the passageway in an axial direction of the passageway. The inner conductor may be pushed into the passageway in the first axial direction. It may be pushed into the passageway far enough so that the inner conductor extends, in the first axial direction, beyond the inner electrode edge.

Alternatively, and independent of other features, in order for the passageway to receive a portion of the inner conductor, the voltage sensing device and/or the carrier element may comprise two or more shell portions, as is mentioned above. A shell portion may be adapted to surround a portion of the circumference of the power-carrying conductor. Two or more shell portions may be engageable with each other to form the voltage-sensing device having a tubular shape and an axial passageway according to the present invention. Two shell portions may be mechanically connectable or connected with each other via a hinge. Two shell portions may be mechanically connected with each other by a resilient element. Generally, a shell portion may comprise the radially-inner electrode and/or the radially-outer electrode. A voltage sensing device and/or the carrier element comprising two or more shell portions may allow the voltage sensing device to be arranged around a power-carrying conductor at a longer distance from an end of the power-carrying conductor, such as around an uninterrupted or uncut power-carrying conductor.

The power-carrying conductor may be a cable connector, such as a cable connector for a medium-voltage or high-voltage power cable. A cable connector may be adapted to receive an inner conductor of a power cable. A cable connector may be adapted for mating, e.g. releasably or permanently, with the cable, i.e. with the inner conductor of the cable, or it may be adapted for mating with a cable adapter. The cable adapter may then be adapted for mating with the cable, i.e. with the inner conductor of the cable. The cable connector may be electrically conductive. It may comprise a conductive surface or a conductive surface portion. A cable connector may have a cylindrical shape. Generally, a shape or a profile of the cable connector may be adapted such that at least a portion of the cable connector can be received in the passageway. In a combination of a voltage sensing device according to the present invention with a cable connector, the shape or profile of the cable connector and the shape and profile of the passageway may be adapted such as to limit a movement of the voltage sensing device relative to the cable connector in one or more directions, when the cable connector is received in the passageway.

The power-carrying conductor may be a bus bar. A bus bar may have a rectangular cross section. The axial passageway of the voltage sensing device may have a rectangular cross section.

The voltage sensing device according to the present invention has a tubular shape. In other words, it has a passageway extending through the voltage sensing device. A tubular-shaped voltage sensing device may have a shape of a hollow cylinder. It may have the shape of a ring, i.e of a short tube. The sensor may have the shape of a bent or distorted tube. The voltage sensing device may have the shape of a rectangular tube, i.e. in a cross section, its outer profile may have the shape of a rectangle. The passageway may, for example, have a circular cross section, an elliptic or an oval cross section, or a rectangular or triangular or any angular or irregular cross section. In a specific embodiment, the outer shape of the voltage sensing device has the shape of a cylinder, and the passageway has a circular cross section and extends through the cylinder along the symmetry axis of the cylinder.

The sensor according to the present invention has an axial passageway, in other words, it has an axial through-hole. The passageway defines axial directions, i.e. directions along the through-hole, and radial directions, i.e. directions perpendicular to the through-hole. The passageway may be adapted to receive a power-carrying conductor, such as an inner conductor of a power cable or an axial section of the inner conductor. The passageway may be adapted to receive a cable connector or an axial section of a cable connector. The passageway may be adapted to receive a bus bar or an axial section of a bus bar.

The inner electrode may be arranged radially inward of the outer electrode. The inner electrode may be arranged on a radially-inner surface of the carrier element, e.g. on a surface delimiting the passageway. Alternatively, it may be arranged inside the carrier element, i.e. in the body of the carrier element. The inner electrode may extend in axial directions along the full length of the passageway or along a longitudinal portion of the passageway. The inner electrode may extend around the full circumference of the passageway or around a part of the circumference of the passageway. In a specific axial direction, the inner electrode extends up to an edge (the "inner electrode edge"). The inner electrode is operable as a first sensing electrode of a sensing capacitor for sensing the voltage of the power-carrying conductor, when the conductor is received in the passageway. The sensing capacitor may comprise the outer electrode as a second sensing electrode and a portion of the carrier element as a dielectric. The inner electrode may be electrically connectable to a power-carrying conductor received in the passageway.

The inner electrode may comprise an electrically conductive metal, such as copper, silver, gold, nickel, aluminium, or an alloy comprising any of these materials. The inner electrode may comprise an electrically conductive polymer. Independent of other features, the radial thickness of the inner electrode may be between 1 micrometer and 1 millimeter. The inner electrode may comprise a non-ferromagnetic material, such as to transmit a magnetic field generated by the power-carrying conductor. It may, for example, comprise nickel-phosphor or an alloy comprising nickel-phosphor.

Similarly, an outer electrode may comprise an electrically conductive metal, such as copper, silver, gold, nickel, aluminium, or an alloy comprising any of these materials. Alternatively, an outer electrode may comprise an electrically conductive polymer. Independent of other features, the radial thickness of the outer electrode may be between 1 micrometer and 1 millimeter. The outer electrode may comprise a non-ferromagnetic material, such as to transmit a magnetic field. It may, for example, comprise nickel-phosphor or an alloy comprising nickel-phosphor.

In a specific embodiment, the inner electrode has the shape of a thin-walled cylinder and is arranged on a surface of the carrier element which surface delimits the passageway, and coaxially with the passageway. This shape and arrangement allow for a particularly easy electrical connection between the inner electrode and a power-carrying conductor received in the passageway.

An outer electrode may be arranged radially outward of at least a portion of the inner electrode. An outer electrode may be arranged on a radially outer surface of the carrier element, e.g. on a surface. Alternatively, it may be arranged inside the carrier element, i.e. in the body of the carrier element. An outer electrode may extend in axial directions along the full length of the passageway or along a longitudinal portion of the passageway. An outer electrode may extend around the full circumference of the carrier element or around a part of the circumference of the carrier element.

Generally, the outer electrode and the inner electrode. may be arranged coaxially, i.e. coaxially with each other. Coaxial arrangement provides the advantage of an efficient capacitive coupling between the inner and outer electrode, which may result in a stronger output signal of the sensing capacitor and/or in a more accurate sensing of the voltage of the power-carrying conductor. Coaxial arrangement is, generally, possible independent of axial extension or circumferential extension of the respective electrodes, and independent of the profile of the respective electrodes, in an axial longitudinal sectional view.

The outer electrode and the inner electrode may be co-extensive in axial directions. Alternatively the outer electrode may be shorter or longer than the inner electrode, in axial directions. In a specific embodiment, the outer electrode has the shape of a thin cylinder and is arranged on an outer surface of the carrier element, and coaxially with the passageway and with the inner electrode, and co-extensive with the inner electrode.

The outer electrode is operable as a second sensing electrode of a sensing capacitor for sensing the voltage of the power-carrying conductor, when the conductor is received in the passageway. The sensing capacitor may comprise the inner electrode as a first sensing electrode and a portion of the carrier element as a dielectric. The outer electrode may be electrically connectable to a power-carrying conductor received in the passageway. The outer electrode may be electrically connectable to a secondary capacitor. The secondary capacitor and the sensing capacitor may form a capacitive voltage divider for sensing a voltage of the power-carrying conductor.

The passageway defines a central axis of the voltage sensing device. The greatest radial distance of the outer electrode from the central axis at any axial location may be less than 50 millimeters. The radial distance of the outer electrode from the central axis is related to the overall radial size of the voltage sensing device, because the voltage sensing device does not need to be much larger than those 50 millimeters. A distance of less than 50 millimeters allows the voltage sensing device to have a relatively small radial size. This may allow the voltage sensing device to be more easily integrated into a cable accessory. Many cable accessories, e.g. many splice devices, provide enough space in their interior to accommodate a voltage sensor in which the greatest radial distance of the outer electrode from the central axis at any axial location may be less than 50 millimeters. In a specific embodiment, the radial distance of the outer electrode from the central axis at any axial location is less than 30 millimeters. In some embodiments, specifically the radial distance may be 25 millimeters or less.

The radial distance between the inner electrode and the outer electrode, measured in one radial direction at any axial position, may be 54 millimeters or less. A voltage sensing device having electrodes that are radially spaced apart by 54 millimeters or less may be particularly small in radial directions, while still offering an acceptable resistance against electrical breakdown between the electrodes. The smaller size may allow an easier integration of the voltage sensing device into a cable accessory. In a specific embodiment, the inner and the outer electrode are arranged concentrically with each other such that the radial distance between the inner electrode and the outer electrode at any axial position is less than 20 millimeters, specifically the radial distance is 9 millimeters.

The carrier element is a solid element. A first portion of the carrier element is arranged between the inner electrode and the outer electrode. The first portion of the carrier element is operable as a dielectric of the sensing capacitor. The first portion may be electrically non-conductive. The first portion may comprise a dielectric material. The carrier element may be a single piece.

Independent of other features, the carrier element may have a radially-inner surface defining at least a portion of the passageway of the voltage sensing device. The radially-inner surface may be adapted to support the inner electrode. The carrier element may have a radially-outer surface defining at least a portion of the outer surface of the voltage sensing device. The radially-outer surface may be adapted to support the outer electrode. The radially-inner and the radially outer surface may be arranged coaxially with each other and coaxial with the passageway.

Independent of other features, the carrier element may comprise, in at least one axial longitudinal sectional view, a protrusion, so that the carrier element is shaped such that the geometrically shortest path along a surface of the carrier element between the outer electrode edge and the inner electrode edge has a length of at least 3 millimeters. Such a protrusion may increase the path length between the electrode edges, and thereby the resistance against surface breakdown, without adding to the overall size of the voltage sensing device in radial direction. A protrusion that protrudes in an axial direction increases the path length without making the sensing device larger in radial directions. Similarly, a protrusion that protrudes in a radial direction increases the path length without making the sensing device larger in axial directions.

In certain voltage sensing devices according to the invention, and independent of other features, a recess may achieve a similar effect. The carrier element may therefore comprise, in at least one axial longitudinal sectional view, a recess, so that the carrier element is shaped such that the geometrically shortest path along a surface of the carrier element between the outer electrode edge and the inner electrode edge has a length of at least 3 millimeters. A recess may be particularly advantageous, because it increases the path length without making the sensing device larger in any direction.

Independent of other features, the carrier element may comprise a material which has a coefficient of thermal expansion of less than $5 \times 10^{-6}$ 1/K at 20° C. The carrier element may, for example, comprise a ceramic material. Many ceramic materials have a coefficient of thermal expansion of less than $5 \times 10^{-6}$ 1/K at 20° C. A low coefficient of thermal expansion may provide for an almost constant radial distance between the inner electrode and the outer electrode, when the temperature of the carrier element varies. This, in turn, may result in a lower variability with temperature of the capacitance of the sensing capacitor formed by the inner electrode, the outer electrode and the first portion of the carrier element. The overall accuracy of the voltage sensor is thereby improved, and/or the requirements to compensate for variations of the sensor output with temperature are relieved or even obsolete. Generally, a ceramic material further offers advantages in mechanical stability and electrical insulation properties.

Independent of other features, the carrier element may comprise a material the permittivity of which varies with temperature, over the temperature range between −20° C. and +60° C., by less than 0.1 percent from a mean permittivity. Such a material may result in a reduced variability with temperature of the capacitance of the sensing capacitor. Again, the overall accuracy of the voltage sensor is thereby improved, and/or the requirements to compensate for variations of the sensor output with temperature are relieved or even obsolete.

The contact element may be comprised in the voltage sensing device, as described above. Alternatively, the contact element may be comprised in a cable connector that can be received in the passageway of the voltage sensing device. The invention therefore provides, in a further aspect, a cable connector that can cooperate with a voltage sensing device as described above. Specifically, it provides a cable connector for mating with a cable adapter or with an inner conductor of a medium-voltage or high-voltage power cable, the cable connector comprising a conductive contact element, adapted to electrically connect the cable connector to the inner or the outer electrode of a voltage sensing device as described above, when a portion of the cable connector is received in at least a portion of the passageway.

The contact element has the same function as described above—it electrically connects the cable connector with the inner electrode or the outer electrode, so that a voltage of the cable connector can be sensed.

For the contact element to establish electrical contact between the inner or the outer electrode and the power-carrying conductor, the inner or the outer electrode, respectively, may have an exposed portion, where a surface of the electrode allows for establishing a mechanical and electrical contact between the contact element and the electrode. Generally, the inner electrode may have an exposed portion, where a surface of the inner electrode allows for establishing a mechanical and electrical contact between the contact element and the electrode A cable connector comprising a contact element can cooperate with a voltage sensing device as described above, which has no contact element. Generally, it may in certain cases be advantageous to have the contact element comprised in the cable connector, because it may be easier and more cost effective to manufacture a cable connector with a contact element than to manufacture a voltage sensing device with a contact element.

The contact element comprised in a cable connector may have a resilient portion. This may be beneficial for the same reasons as described above. Similarly, the contact element may be rigid and may be resiliently supported by the cable connector.

In certain embodiments, in which the contact element is comprised in the cable connector as described above, the contact element may comprise a resilient portion. Further, the contact element may be adapted to electrically connect the cable connector to the inner electrode of the voltage sensing device, when a portion of the cable connector is received in at least a portion of the passageway of the voltage sensing device.

The invention further provides a combination of a voltage sensing device as described above with a high-voltage or medium-voltage power-carrying conductor for a power network, wherein the passageway receives at least a portion of the power-carrying conductor.

The invention further provides a combination of a voltage sensing device as described before with a cable connector, which cable connector is adapted to mate with a cable adapter or with an inner conductor of a power cable, wherein the passageway receives at least a portion of the cable connector. The inner electrode or the outer electrode may be electrically connected to the cable connector. This may allow for sensing a voltage of the cable connector, as described above.

The invention further provides a combination of a voltage sensing device as described above with a high-voltage or medium-voltage power cable, which cable comprises an inner conductor, wherein the passageway receives at least an axial section of the inner conductor. The inner electrode or the outer electrode may be electrically connected to the inner conductor of the cable. This may allow for sensing a voltage of the inner conductor of the cable, as described above.

The invention further provides a cable accessory for use with a high-voltage or medium-voltage power cable for a power network, the cable accessory comprising a voltage sensing device as described above. In a cable accessory, such as a splice device, a termination, or a separable connector, the inner conductor of a cable is readily accessible. It is therefore particularly effective to have the voltage sensing device comprised in the cable accessory, because the cable does not need to be stripped in a further location for mounting the voltage sensing device. The cable accessory may be a splice device, a cable termination, or a separable connector. The cable accessory may form a cavity. The voltage sensing device may be arranged in the cavity. The cavity may contain non-conductive polymeric material. The cable accessory may comprise an electrically conductive envelope.

The voltage sensing device according to the present invention may be arranged inside the cable accessory, i.e. in a space or in a cavity inside an outer shell or housing of the cable accessory. This arrangement is particularly advantageous, because the voltage sensor is then protected by the cable accessory against environmental impact, which may increase the usable lifetime of the voltage sensing device and its accuracy.

The invention further provides a method of arranging a voltage sensing device on a power-carrying conductor for a power network, such as a cable connector or an inner conductor of a medium-voltage or high-voltage power cable or a bus bar, the method comprising, in this sequence, the steps of a) providing a voltage sensing device as described above, and providing a power-carrying conductor, the power-carrying conductor being adapted such that at least a portion of the power-carrying conductor is receivable in at least a portion of the passageway;

b) moving the voltage sensing device and the power-carrying conductor relative to each other such that at least a portion of the passageway receives at least a portion of the power-carrying conductor.

Figure 2:
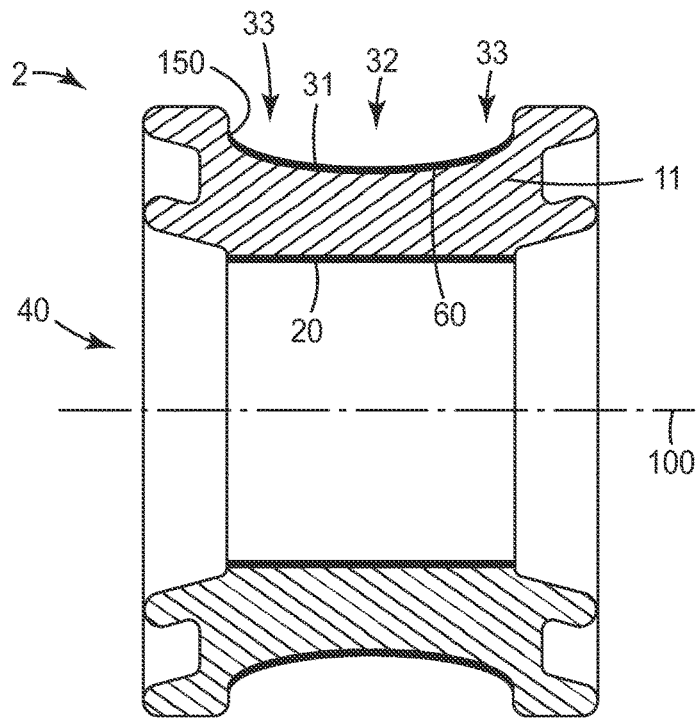
Figure 3:
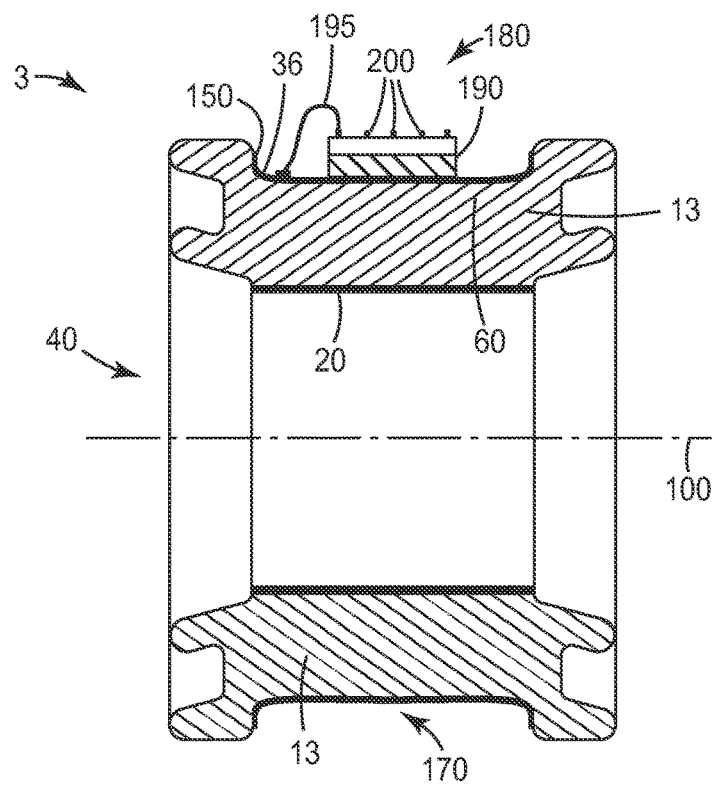
Figure 4:
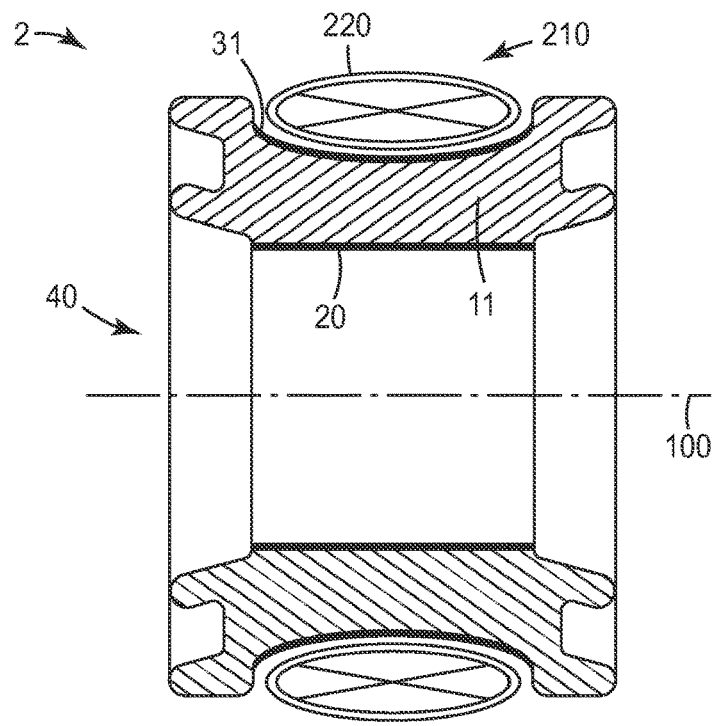
Figure 5:
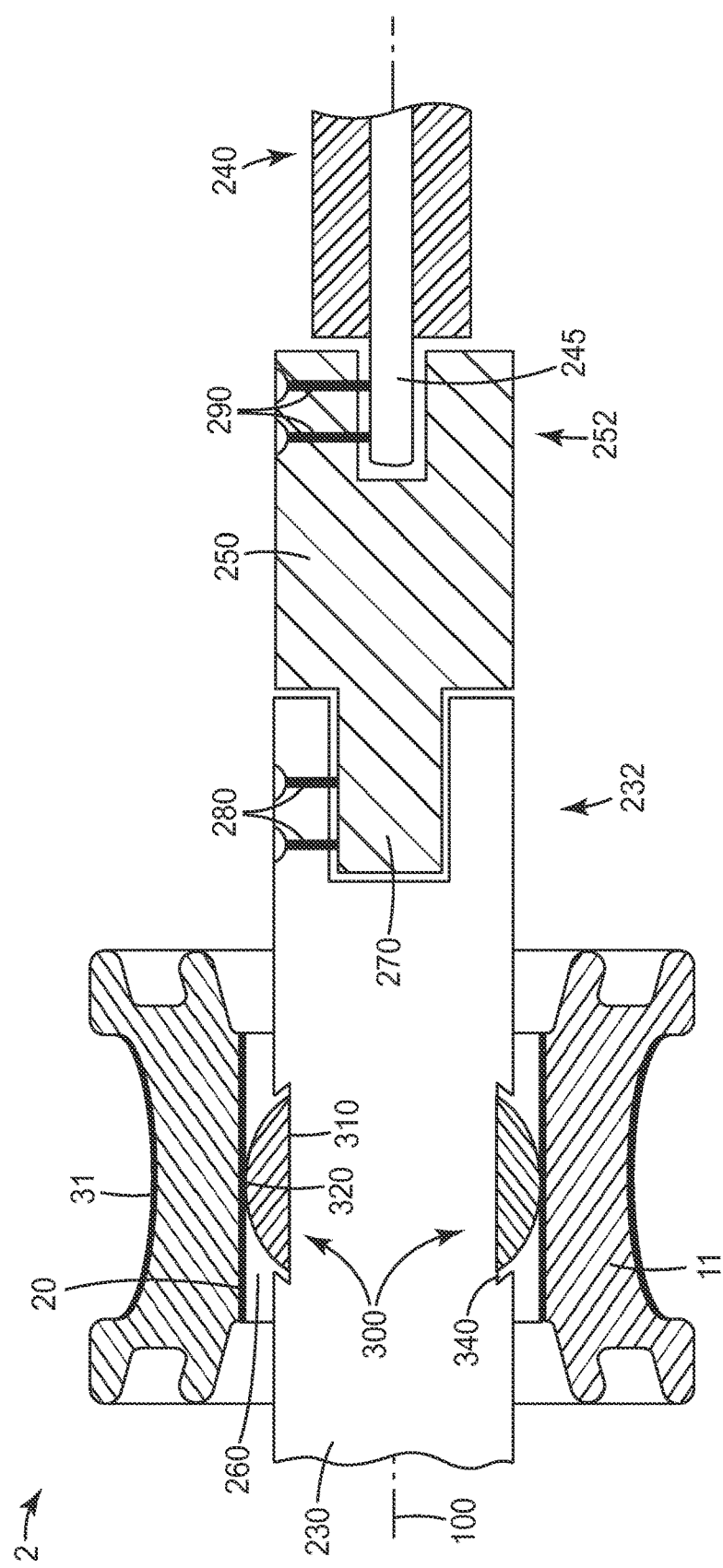
Figure 7:
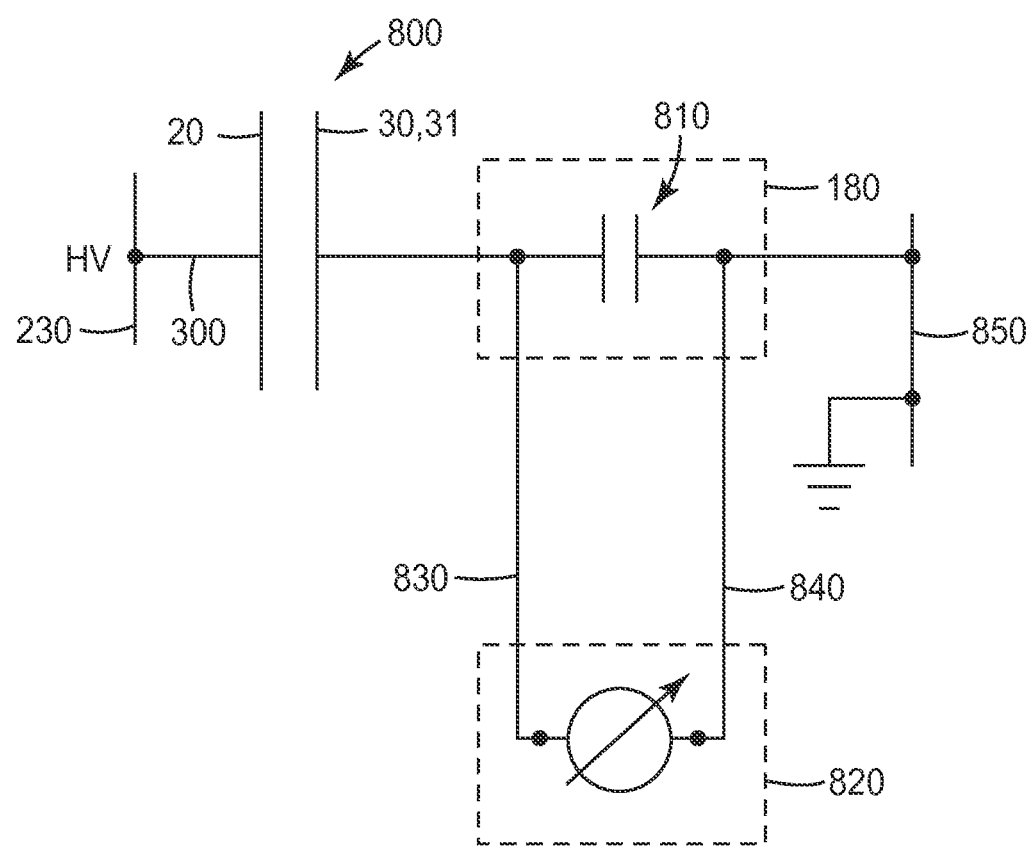
Figure 8:
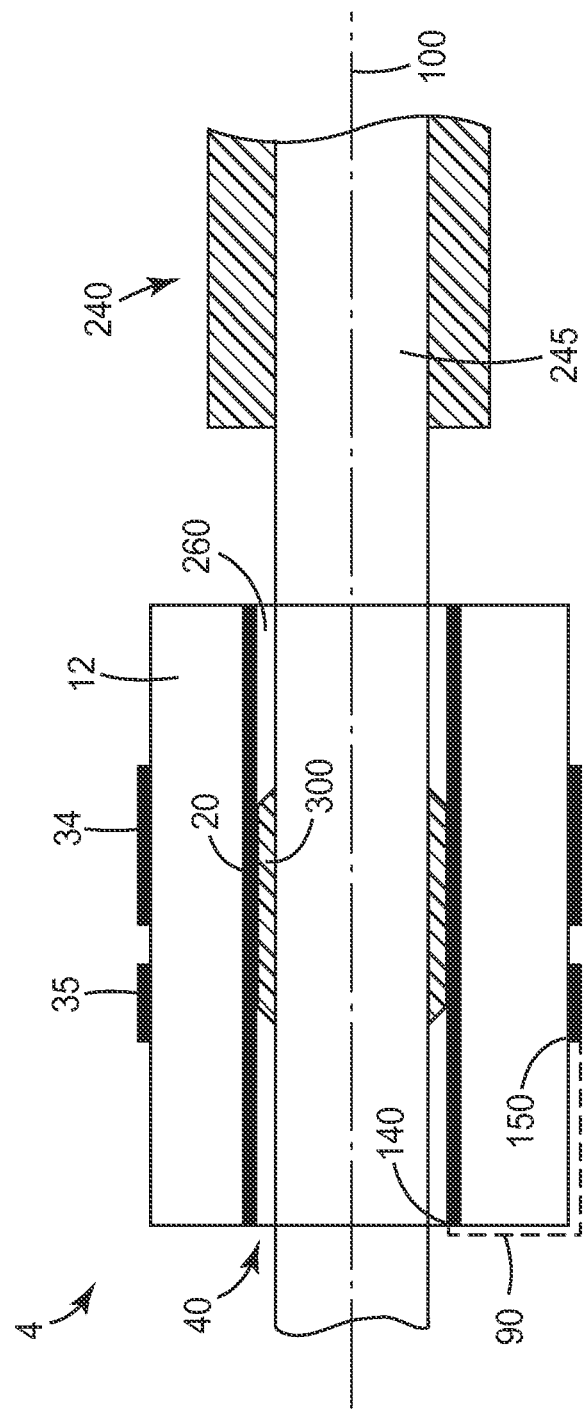
Figure 9:
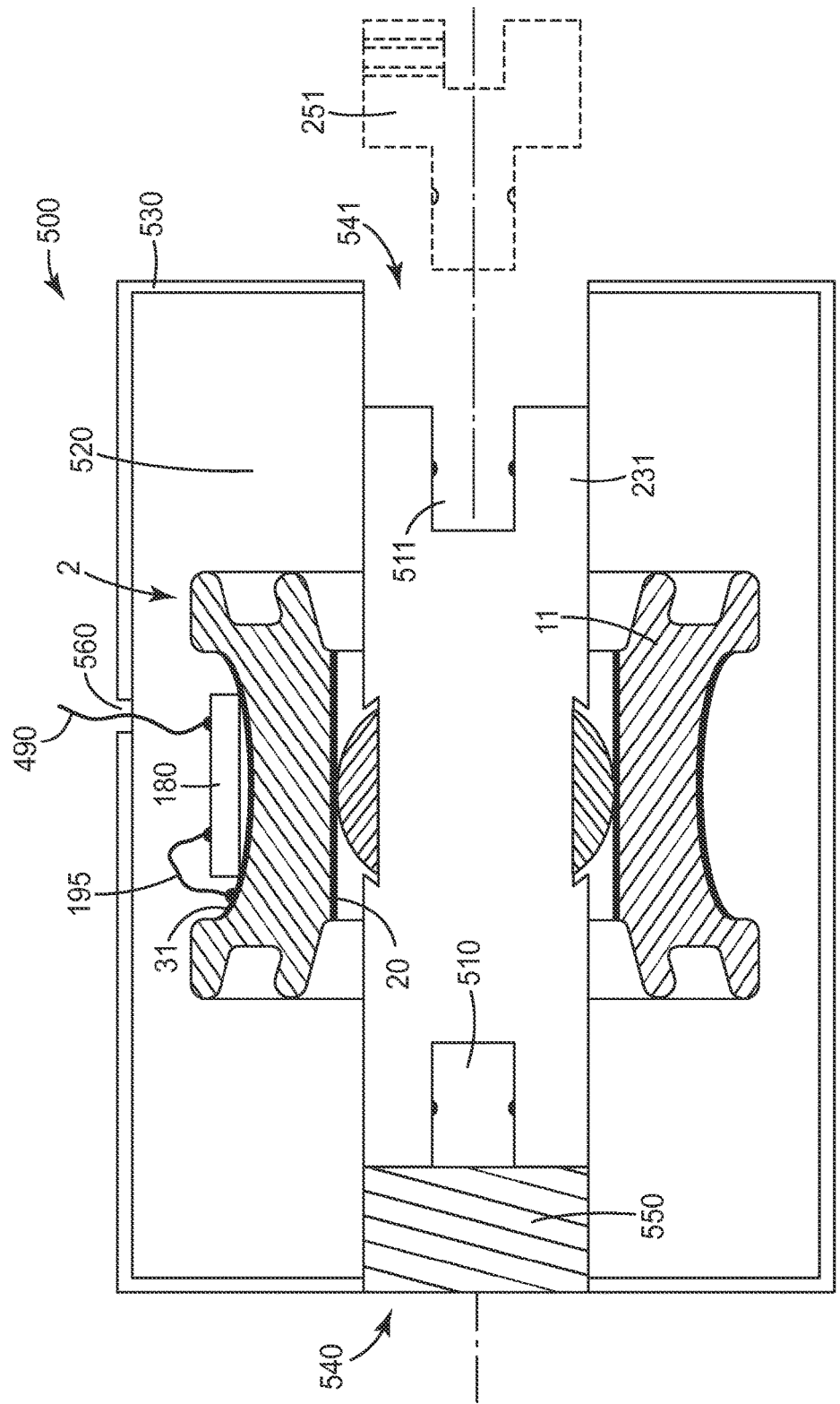
Figure 10:
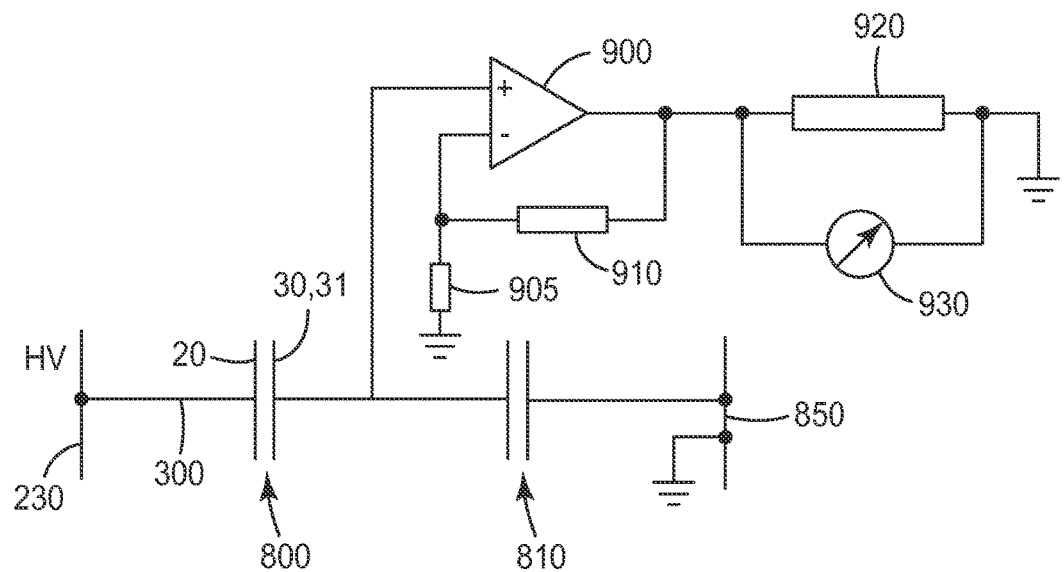
Figure 11:
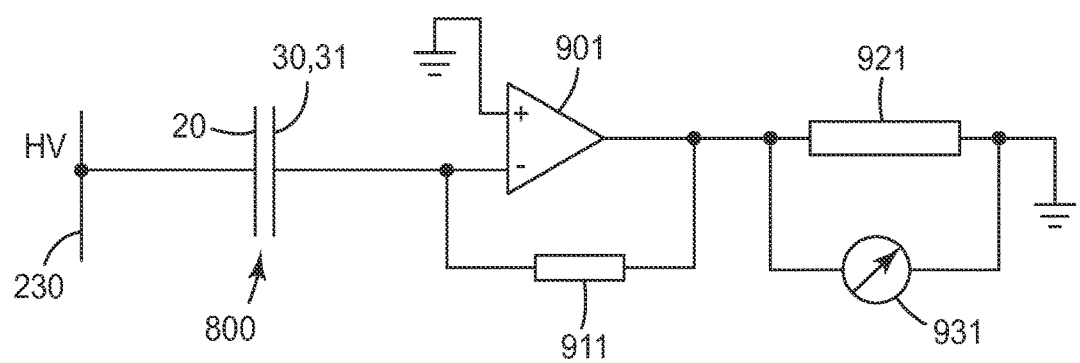

The invention will now be described in more detail with reference to the following Figures exemplifying particular embodiments of the invention:

FIG. 1 Longitudinal section of a voltage sensing device according to the invention;

FIG. 2 Longitudinal section of a further voltage sensing device according to the invention, having a curved outer electrode;

FIG. 3 Longitudinal section of a further voltage sensing device according to the invention, comprising a PCB;

FIG. 4 Longitudinal section of the voltage sensing device of FIG. 2, with a Rogowski coil;

FIG. 5 Longitudinal section of the voltage sensing device of FIG. 2, arranged around a cable connector;

FIG. 6A-E Perspective views of various types of contact elements according to the invention;

FIG. 7 Electric circuit diagram of a voltage sensing device according to the invention;

FIG. 8 Longitudinal section of a further voltage sensing device according to the invention, having an elongated shape;

FIG. 9 Schematic longitudinal section of a cable accessory comprising the voltage sensing device 2 shown in FIG. 5;

FIG. 10 Electric circuit diagram of an alternative voltage sensing device according to the invention; and FIG. 11 Electric circuit diagram of a further alternative voltage sensing device according to the invention.

Herein below various embodiments of the present invention are described and shown in the drawings wherein like elements are provided with the same reference numbers. Some elements shown in the drawings are not to scale, and some dimensions are exaggerated for greater clarity.

FIG. 1 shows, in an axial longitudinal section, a voltage sensing device 1 according to the invention. It comprises a carrier element 10, an inner electrode 20 and an outer electrode 30. The carrier element 10 has an axial passageway 40, which is symmetric about a central axis 100. The passageway 40 defines axial directions, indicated by arrow 110, and radial directions, indicated by arrow 120. In axial directions 110, the voltage sensing device 1 is relatively short, so that the tubular-shaped voltage sensing device 1 has the shape of a ring. The passageway 40 can receive a cable connector, as is shown in FIG. 5 below. The voltage sensing device 1 shown in FIG. 1 has an extension of approximately 50 millimeters in axial directions 110. Its outer diameter, i.e. its extension in radial directions 120, is approximately 65 millimeters. This size allows integration of the voltage sensing device 1 into a typical cable accessory for a medium-voltage or high-voltage cable.

The carrier element 10 comprises a radially-inner (or inner) surface 50, on which the inner electrode 20 is arranged, and a radially-outer (or outer) surface 60, on which the outer electrode 30 is arranged. The inner diameter of the inner surface 50 is approximately 34 millimeters. The radial distance between the inner surface 50 and the outer surface 60 is approximately 10 millimeters.

The carrier element 10 is solid, electrically non-conductive and comprises a ceramic material. The ceramic material is silicon nitride ($Si_3N_4$). The coefficient of thermal expansion of this ceramic material is approximately $2.5 \times 10^{-6}$ 1/K at a temperature of 20° C. When the voltage sensing device 1 and the carrier element 10 heat up, the carrier element 10 expands only by a very small amount, which results in the electrodes 20, 30 having almost the same radial distance, within a wide temperature range.

The profile of the carrier element 10 in the longitudinal section shown in FIG. 1 comprises, on one side of the carrier element 10, two bulges or protrusions 70, 80, namely an inner, i.e. radially inner, protrusion 70 and an outer protrusion 80. Identical protrusions 71, 81 are arranged on the opposite side of the carrier element 10. The protrusions 70, 71, 80, 81 form ring-shaped elevations on the lateral surfaces of the carrier element 10. Their function is to increase the minimum length of a path 90 between the inner electrode 20 and the outer electrode 30 along the surface of the carrier element 10. The longer the path 90 between the electrodes 20, 30, the higher is the resistance of the voltage sensing device 1 against surface breakdown between the electrodes 20, 30. The protrusions 70, 80, 71, 81 extend from the carrier element 10 mainly in axial directions 110. This arrangement keeps the overall diameter of the voltage sensing device 1 small, while reducing the risk of surface breakdown between the electrodes 20, 30. In the voltage sensing device 1 shown in FIG. 1, the path 90 has a length of approximately 33 millimeters.

The inner electrode 20 comprises a nickel-phosphor plating on the inner surface 50 of the carrier element 10. The inner electrode 20 surrounds the passageway 40 completely, except for the lateral end portions 130, 131 of the carrier element 10. In one axial direction, indicated by arrow 110a, the inner electrode 20 extends up to an inner electrode edge 140.

Also the outer electrode 30 comprises a nickel-phosphor plating, arranged on the outer surface 60 of the carrier element 10. Nickel-phosphor provides a sufficient hardness and does not corrode quickly. It also facilitates soldering, so that a wire can be connected to the outer electrode 30 easily. An additional layer of gold may be provided for even better electrical conductivity. Generally, the outer electrode may comprise any suitable conductive material, such as copper, silver, or gold. In the axial direction indicated by arrow 110a, the outer electrode 30 extends up to an outer electrode edge 150. In the plane of the longitudinal section shown in FIG. 1, the path 90 between the inner electrode edge 140 and the outer electrode edge 150 along the surface of the carrier element 10 has a length of approximately 30 millimeters. This length is sufficient to considerably reduce the risk of surface breakdown between the electrodes 20, 30, when the voltage difference between the electrodes is in the medium- or high-voltage range, i.e. between 1 kilovolt and 110 kilovolts. In the longitudinal section of FIG. 1, the profile of the outer electrode 30 appears as a straight line, i.e. all portions of the outer electrode 30 are radially equally close to the central axis 100. In the embodiment shown in FIG. 1, the outer electrode 30 is a one-dimensionally curved surface. Also the inner electrode 20 is a one-dimensionally curved surface.

The carrier element 10, the inner electrode 20 and the outer electrode 30 are rotationally symmetric about the axis 100. The inner electrode 20 and the outer electrode 30 are arranged concentrically with respect to each other. The electrodes 20, 30 and the carrier element 10 are arranged concentrically with respect to each other. The electrodes 20, 30 and the carrier element 10 are centred about the axis 100. The radial distance between the inner electrode 20 and the outer electrode 30 is approximately 10 millimeters. This distance is sufficient to considerably reduce the risk of electrical breakdown through the material of the carrier element 10 between the electrodes 20, 30, when the voltage difference between the electrodes 20, 30 is in the medium- or high-voltage range.

The passageway 40 can receive a cable connector of a medium-voltage or high-voltage power cable, as is described in detail below. The voltage sensing device 1 can thus be arranged around a cable connector. Generally, the passageway 40 can receive also other types of power-carrying conductors, such as an inner conductor of a power cable or a bus bar.

The inner electrode 20 and the outer electrode 30 can be operated as two electrodes of a sensing capacitor. A middle portion 160 of the carrier element 10 is arranged between the inner electrode 20 and the outer electrode 30. This middle portion 160 can be operated as a dielectric of this sensing capacitor. The sensing capacitor can be connected in series with a secondary capacitor, so that the sensing capacitor and the secondary capacitor form a capacitive voltage divider. The inner electrode 20 can be electrically connected to a cable connector or to an inner conductor of a medium-voltage or high-voltage power cable, as will be described below. The capacitive voltage divider can then be used to sense the voltage of the cable connector or the inner conductor of the cable. FIG. 7 shows a corresponding circuit diagram.

The outer electrode of a voltage sensing device according to the invention can be a two-dimensionally curved surface. Such an alternative voltage sensing device 2 is shown in FIG. 2. The difference to the voltage sensing device of FIG. 1 is that, in the axial longitudinal sectional view shown in FIG. 2, the outer surface 60 of the carrier element 11 is shaped such that the outer electrode 31 has a curved profile. In the axial longitudinal sectional view shown in FIG. 2, a central portion 32 of the outer electrode 31 is radially closer to the central axis 100 of the passageway 40 than rim portions 33 are. In particular, the central portion 32 is radially closer to the central axis 100 than the outer electrode edge 150 is. The curved profile of the outer electrode 31 reduces the risk of an electrical breakdown between the inner electrode 20 and the outer electrode 31 through the material of the carrier element 11, because the concentration of the electrical field at the edges of the outer electrode 31, e.g. at the outer electrode edge 150, is lower. In a specific alternative embodiment, the outer electrode 31 has a curved profile, in an axial longitudinal sectional view, and the curved profile is a Rogowski profile.

FIG. 3 is an axial longitudinal section of a third voltage sensing device 3 according to the invention. The carrier elements 10, 11, 13 of the voltage sensing device 1, 2, 3 of FIGS. 1, 2 and 3 comprise a recess 170 on their respective outer surface 60s, which recess 170 accommodates the outer electrode 30, 31, 36 on its bottom. In the voltage sensing device 3, the outer electrode 36 has a curved profile, in the axial longitudinal sectional view of FIG. 3. The curved profile comprises a central straight or flat section, and two curved sections, adjacent to the straight section, on either side of the straight section. The curved sections are curved in a direction facing away from the central passageway 40. The central flat section is radially closer to the central axis 100 of the passageway 40 than the outer electrode edge 150 is.

A further difference to the voltage sensing devices 1, 2 of FIGS. 1 and 2 is that the voltage sensing device 3 comprises a printed circuit board ("PCB") 180. The PCB 180 is rigid. It is arranged in the recess 170 of the carrier element 13. The PCB 180 comprises electrical and electronic components 200 which serve to sense and process the voltage signal of the outer electrode 36. The PCB 180 is electrically connected to the outer electrode 36 via a wire 195, which is soldered to the outer electrode 36 at its one end, and to a contact on the PCB 180 at its other end. Alternative methods for electrically connecting the outer electrode 36 with the PCB 180 are contemplated, e.g. methods involving electrically conductive adhesives, ultrasonic bonding, mechanical clamping or laser welding. In the sensing device 3 of FIG. 3, the PCB 180 is affixed to the carrier element 13 by an electrically insulating adhesive tape (not shown) that is wound around the PCB 180 and over the outer electrode 36.

In an alternative embodiment, the PCB 180 is a flexible PCB. It extends circumferentially around the outer electrode 36 up to about one third of the circumference of the outer electrode 36. The rear, i.e. radially inner, surface of the PCB 180 forms an exposed conductive region 190. This exposed conductive region 190 is in electrical and mechanical contact with the outer electrode 36, so that a voltage signal of the outer electrode 36 is available on the PCB 180 for sensing and processing without having to use a wire. The direct electrical and mechanical contact between the outer electrode 36 and the PCB 180 minimizes any voltage drop between these elements and thereby further increases the accuracy of the voltage sensing device 3.

The recess 170 of the voltage sensing devices 1, 2, 3 shown in FIGS. 1, 2 and 3 can also accommodate a current sensing device such as a Rogowski coil 210, as is shown in FIG. 4. The Rogowski coil 210 can be used to sense a current through a power-carrying conductor received in the passageway 40. The Rogowski coil 210 is flexible and can be bent to conform circumferentially around the outer electrode 31. The conductive turns of the actual coil are accommodated in a non-conductive envelope 220, which electrically isolates them from the outer electrode 31. The envelope 220 is made of a flexible polymeric material. The recess 170 in the carrier element 11 allows to accommodate a current sensing device 210 such as a Rogowski coil without adding much to the outer diameter of the voltage sensing device 3. This allows the voltage sensing device 3 to be small in size, so that it can be accommodated in a cable accessory.

The Rogowski coil 210 picks up the magnetic field generated by a current through the power-carrying conductor in the passageway 40. Advantageously, the outer electrode 31 therefore consists of an electrically conductive, non-ferromagnetic material. Such a material allows magnetic fields to be transmitted through the outer electrode 31 to the Rogowski coil 210. In the embodiment shown in FIG. 4, the outer electrode comprises a nickel-phosphor plating, which is non-ferromagnetic.

In an alternative embodiment, the recess 170 accommodates both a PCB 180 and a current sensing device 210. The current sensing device 210 is electrically connected to electric or electronic elements 200 on the PCB 180, e.g. by a wire, so that signals from the current sensing device 210 are transmitted to the PCB 180 for processing.

Although the recess 170 offers a particularly space-saving manner of accommodating a PCB 180 and/or a current sensing device 210, the recess 170 is optional. A PCB 180 and/or a current sensing device 210 can alternatively be arranged on a voltage sensing device that comprises no recess 170.

FIG. 5 shows, in an axial longitudinal section, the voltage sensing device 2 arranged around a cable connector 230. FIG. 5 further shows a cable adapter 250 and an end portion of a power cable 240. The connector 230 is a cable connector for medium-voltage or high-voltage power cables. An end portion of the inner conductor 245 of the high-voltage power cable 240 is secured to the connector 230 via a cable adapter 250. The cable adapter 250 is electrically conductive, so that the connector 230 is electrically connected to the inner conductor 245. The connector 230 is therefore on the same voltage as the inner conductor 245.

The connector 230 is made of aluminium. Its body and its surfaces are therefore electrically conductive. The sensor 2 receives the connector 230 in the axial passageway 40. The connector 230 is of cylindrical shape. Its outer diameter is smaller than the inner diameter of the passageway 40. This avoids mechanical stress, which might be caused by the metal connector 230 and the ceramic carrier element 11 expanding at different rates when their temperature rises. Ceramic materials normally have a considerably lower coefficient of thermal expansion than most metals. If the connector 230 would form a tight fit with the carrier element 11 and the inner electrode 20 at room temperature, a rise in temperature would cause the connector 230 to expand more than the carrier element 11. This may cause the carrier element 11 to break. For this reason, the inner diameter of the passageway 40 of the carrier element 11 is chosen such as to leave a radial gap 260 of about 0.5 millimeters width between the radially outer surface of the connector 230 and the radially inner surface of the carrier element 11. In this specific embodiment, the inner electrode 20 is much thinner than 0.5 millimeters, so that its thickness has only a negligible impact on the width of the gap 260.

A first end portion 232 of the connector 230 forms a receptacle, into which a peg 270 of the cable adapter 250 can be inserted for mating. The peg 270 can be secured to the connector 230 by screws 280. Once mated, the cable adapter 250 is electrically and mechanically connected with the connector 230.

The cable adapter 250, in turn, comprises a receptacle at a cable end portion 252, opposed to the end portion comprising the peg 270. The inner conductor 245 of the cable 240 can be inserted into the receptacle. The inner conductor 245 can then be secured to the cable adapter 250 by cable fastening screws 290. Alternative cable adapters 250 are crimped on the inner conductor 245, not requiring fastening screws 290. Once secured, the cable inner conductor 245 is electrically and mechanically connected with the cable adapter 250 and thereby with the connector 230.

The sensor 2 senses a voltage of the connector 230 and thereby of the inner conductor 245 in a capacitive manner. For that purpose, the connector 230 is electrically connected to the inner electrode 20. This connection is established by a plurality of conductive lamellae 300. Two of these lamellae are visible in FIG. 5. Each lamella 300 is arranged in the gap 260 between the connector 230 and the inner electrode 20. Each lamella 300 has a first contact portion 310 which is in mechanical and electrical contact with the outer surface of the cable connector 230, and a second contact portion 320 which is in mechanical and electrical contact with the inner electrode 20. Each lamella 300 thereby establishes an electrical connection between the connector 230 and the inner electrode 20. The inner electrode 20 is thus on the same voltage as the connector 230. A single lamella 300 would, in principle, be sufficient to establish an electrical connection between the connector 230 and the inner electrode 20. A plurality of lamellae 300, however, provides for more contact points and thus for a better electrical connection. Also, a plurality of lamellae 300 provide for a certain degree of redundancy, so that the contact between connector 230 and inner electrode 20 is still present, even if one lamella 300 breaks or fails.

When the sensor 2 and the connector 230 heat up, the connector 230 expands at a higher rate than the carrier element 11 of the sensor 2, so that the gap 260 between the inner electrode 20 and the connector 230 gets smaller in a radial direction. In order to ensure a reliable electrical connection between the inner electrode 20 and the connector 230 at different temperatures, the lamellae 300 are resilient, so that they bridge the gap 260 between the inner electrode 20 and the connector 230, independent of the radial width of the gap 260. Alternatively, the lamellae 300 themselves could be rigid, and their support could be resilient. This allows for some movement of the lamellae 300, as the temperature changes, in such a way, that the lamellae 300 bridge the gap 260 and provide electrical connection at any temperature.

A plurality of such lamellae 300 are comprised in a lamella assembly 330, which is explained in more detail in the context of FIG. 6. The lamella assembly 330 is electrically conductive and electrically connects all the lamellae 300 in it with each other. In the lamella assembly 330, lamellae 300 are suspended in a resilient manner, so that the lamellae 300 can be elastically displaced. This ability to be displaced helps the lamellae 300 bridging the gap 260 when temperature changes.

The cable connector 230 comprises a fixation recess 340 around its circumference for attaching a lamella assembly 330 to the connector 230. In an axial longitudinal section, as in FIG. 5, the fixation recess 340 has a notched profile, which allows a lamella assembly 330 to engage mechanically with the connector 230 in the fixation recess 340. Other methods of attachment are contemplated, e.g. using fastening means, welding, soldering, or adhesive methods. Whatever the attachment method, it must maintain an electrical connection between the connector 230 and the lamellae 300, so that the lamellae 300 can electrically connect the connector 230 and the inner electrode 20. In certain embodiments, the lamella assembly 330 does not need to be attached to the connector 230 at all, but it may be held in place by the carrier element 10, 11.

In the embodiment shown in FIG. 5, the lamella assembly 330 is attached to the connector 230. Alternatively, the lamella assembly 330 may be attached to the carrier element 10, 11. The lamella assembly 330 may be attached to the inner electrode 20 or to the carrier element 10, 11. Attachment may be done in similar ways as explained above. Alternatively, attachment may be done adhesively. In that case, the inner electrode 20 is electrically connected to the lamellae 300, before the passageway 40 receives the connector 230. Independent of the attachment of the lamella assembly 330 to the connector 230 or to the carrier element 10, 11, the lamellae 300 mechanically contact the inner electrode 20 and the cable connector 230. Thereby, a lamella electrically connects the inner electrode 20 and the cable connector 230 with each other.

The cable connector 230 shown in FIG. 5 has the shape of a longitudinal cylinder. The second end portion opposed to the first end portion 232 may comprise a further receptacle for receiving a cable adapter like cable adapter 250 or for receiving an end portion of an inner conductor of a second cable, similar to the inner conductor 245 of the first cable 240 connected to the connector 230 at its first end portion 232. Alternatively, the second end portion may comprise a lug, or a similar attachment means, for connection of the cable connector 230 to another element of an electrical installation.

FIGS. 6A-E show, in perspective views, different embodiments of lamella assemblies 330, namely lamella assemblies 330a, 330b, 330c, 330d. These lamella assemblies 330 are adapted to be attached to a connector 230 in a circumferential fixation recess 340. The lamella assemblies 330a-d are made from conductive metal. They comprise a plurality of respective lamellae 300a-d. Both the lamellae assemblies 330a-d and their lamellae 300a-d are resilient. The lamellae 300a-d are suspended in a resilient manner in their respective lamella assembly 330a-d. Each lamella assembly 330a-d is shaped such as to form a base portion 350a-d, which engages with the notched profile of the fixation recess 340 in the connector 230. The individual lamellae 300a-d protrude away from the base portion 350a-d, so that they protrude radially outward of the fixation recess 340 and can contact the inner electrode 20, when the respective lamella assembly 330a-d is arranged in the fixation recess 340.

The lamella assemblies 330a-d are shown flat. In order to engage them with the fixation recess 340, they can be bent such that their bases 350a-d are arranged in the fixation recess 340, circumferentially around the cable connector 230 or at least around a part of the circumference of the cable connector 230.

Figure 6A:
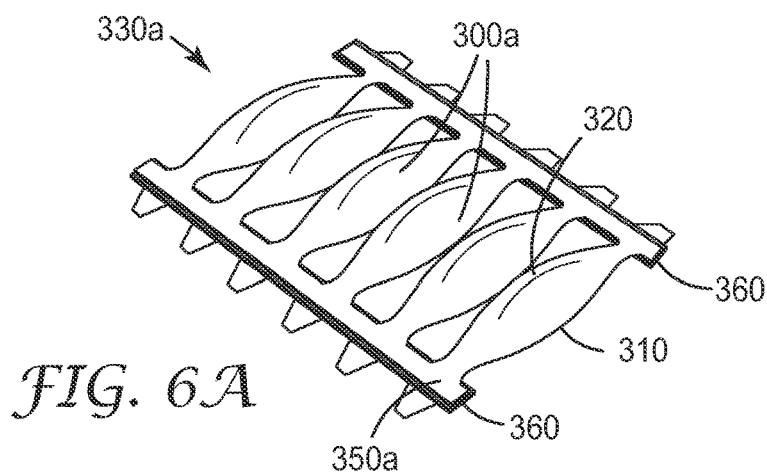

In FIG. 6A, the base portion 350a of the lamella assembly 330a comprises two flat lateral rails 360, between which flat, almond-shaped lamellae 300a are resiliently suspended. The lower portion (in the Figure) of each lamella 300a is the first contact portion 310 for contacting the outer surface of the cable connector 230. The upper portion is the second contact portion 320 for contacting the inner electrode 20 of the voltage sensing device 1, 2.

Figure 6B:
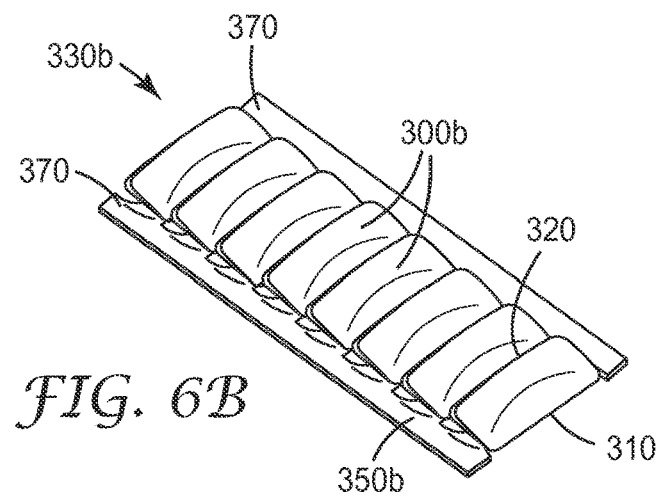

Also the lamella assembly 330b, shown in FIG. 6B, has a base portion 350b comprising two flat rails 370, between which round-bodied lamellae 300b of generally rectangular shape are resiliently suspended.

Figure 6C:
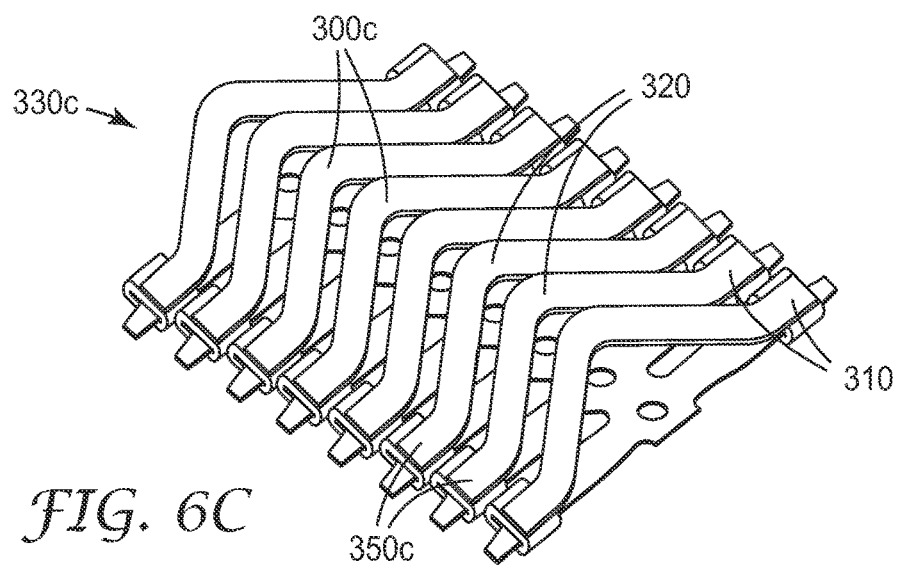

The lamella assembly 330c of FIG. 6C has no lateral rails, but each lamella 300c provides a base portion 350c for engagement with the notched profile of the fixation recess 340 in the connector 230. The lamellae 300c are not flat, but each of them has the shape of an elongated conductor, which bulges radially outward to contact the inner electrode 20.

Figure 6D:
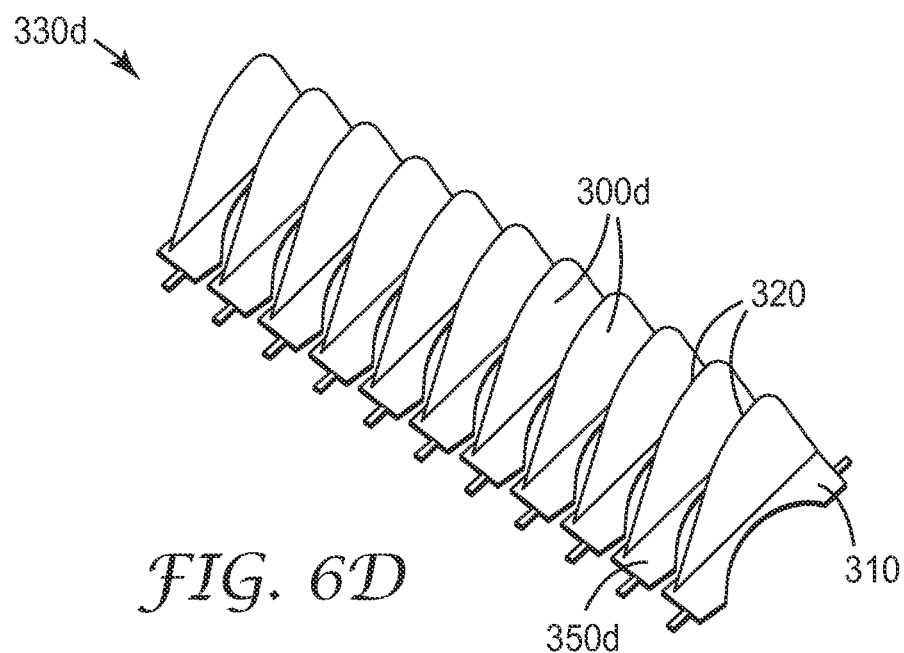

FIG. 6D shows a lamella assembly 330d which has flat, triangular-shaped lamellae 300d. The base of the lamellae 300*d* form the base 350*d* of the lamella assembly 330*d*, which can engage with the notched profile of the fixation recess 340 in the connector 230. The tips of the triangles of the lamellae 300*d* are for contacting the inner electrode 20.

Figure 6E:
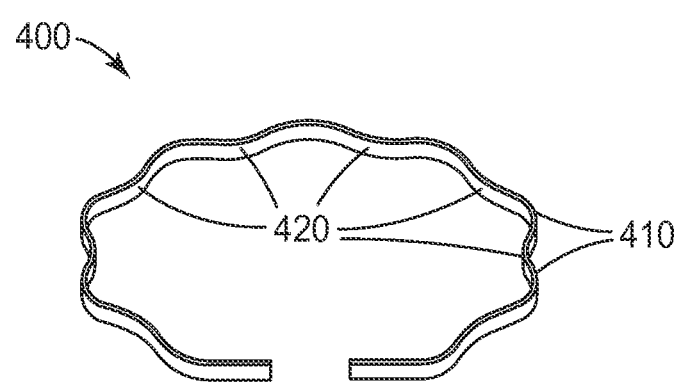

The lamella assemblies 330 are, generally spoken, contact assemblies for contacting the cable connector 230, on one hand, and the inner electrode 20 on the other hand. An alternative contact assembly, for that purpose, is shown in FIG. 6E: a resilient snap ring 400. The snap ring 400 is made from conductive metal. While generally circular in shape, it has bulges 410 which protrude radially outward, and depressions 420, circumferentially arranged between the bulges 410, which protrude radially inward. The snap ring 400 can be arranged around the circumference of the cable connector 230, in the circumferential fixation recess 340, so that the bulges 410 protrude from the fixation recess 340 and can contact the inner electrode 20, while the depressions 420 contact the outer surface of the cable connector 230 in the fixation recess 340. Depending on the width of the fixation recess 340, i.e. its axial extension, one or more such snap rings 400 can be arranged in the fixation recess 340.

As an alternative to contact elements comprising resilient metal, a contact element may comprise an elastomeric material. The elastomeric material may be electrically conductive or it may have an electrically conductive surface. The elastomeric material may be arranged on an outer surface of the cable connector 230 or on a surface of the inner electrode 20, so that the conductive elastomeric material and/or its conductive surface provide an electrical connection between the cable connector 230 or on a surface of the inner electrode 20.

FIG. 7 is an electrical circuit diagram, showing the electrical functionality of the various elements of the capacitive voltage sensors 1, 2, 3, according to the present invention. The sensing capacitor 800 has a first electrode and a second electrode. The first electrode is the inner electrode 20 of the sensor 1, 2, 3, and the second electrode is the outer electrode 30, 31 of the sensor 1, 2, 3. The sensing capacitor 800 is electrically connected in series with a secondary capacitor 810, so that the sensing capacitor 800 and the secondary capacitor 810 can be operated as a capacitive voltage divider. The secondary capacitor 810 may be arranged on a printed circuit board (PCB) element, e.g. on the PCB 180 shown in FIG. 3. The PCB 180 may be arranged very close to the sensor 1, 2, 3, even in direct contact with the outer electrode 31, as shown in FIG. 3. In that case, the electrical contact between the printed circuit board element 180 and the outer electrode 30, 31 may be made via an exposed conductive region 190 of the PCB element 180. Alternatively the PCB 180 may be arranged at a distance from the sensor 1, 2, 3, and electrically connected to the outer electrode 30, 31 by a wire. Electrically, the secondary capacitor 810 is connected, on one side, to the sensing capacitor 800 and, on the other side, to ground. Because the cable connector 230 is electrically connected to the inner electrode 20 via the lamellae 300, measuring the voltage of the inner conductor 245 can be done by measuring the voltage of the inner electrode 20. The voltage of the inner electrode 20 of the sensing capacitor 200 versus ground is measured by measuring the voltage across the secondary capacitor 810. The secondary capacitor 810 is therefore electrically connected to a measurement device 820 via a sensor wire 830 and a ground wire 840. The measurement device 820 is electrically connected in parallel to the secondary capacitor 810 via the sensor wire 830 and the ground wire 840. The measurement device 820 measures the voltage between the sensor wire 830 and the ground wire 840. The ground wire 840 is electrically connected to ground via a conductive or semiconductive element 850.

In the capacitive voltage divider described above, the voltage of the inner conductor 245 is sensed by measuring a voltage across the secondary capacitor 810. Alternatively, the voltage of the inner conductor 245 can be sensed by measuring a current through the sensing capacitor 800.

FIG. 8 shows a further voltage sensing device 4 according to the invention, in a longitudinal section. It has a tubular shape. Its axial extension is larger than its radial extension. This voltage sensor 4 receives, in its passageway 40, an inner conductor 245 of a power cable 240. The inner electrode 20 is electrically connected, via lamellae 300, with the conductor 245 directly. Each of the two lamellae 300 that are visible in FIG. 8 contact the inner electrode 20, on one hand, and the inner conductor 245, on the other hand, thereby bridging the gap 260 between these two elements.

The voltage sensing device 4 has been arranged around the inner conductor 245 by pushing an end portion of the inner conductor 245 (not shown, located on the left-hand side of the cable 240, in the Figure) into the passageway 40 in an axial direction 110.

Instead of one outer electrode 30, 31, the sensing device 4 of this embodiment has two outer electrodes, a first outer electrode 34 and a second outer electrode 35. The first outer electrode 34 is wider, in axial directions, than the second outer electrode 35. These outer electrodes 34, 35 are arranged on the outer surface 60 of the carrier element 12, axially offset with respect to each other and separated by a non-conductive electrode gap. The first outer electrode 34 can be used for sensing a voltage of the inner conductor 245, using the capacitive voltage divider method explained above, wherein a portion of the carrier element 12 is operated as the dielectric of a sensing capacitor, which capacitor further comprises the inner electrode 20 and the first outer electrode 34 as its electrodes.

The second outer electrode 35 can be used for different purposes. It can, for example, be used as a sensing electrode of a further, second sensing capacitor for sensing the voltage of the inner conductor 245. This second sensing capacitor comprises the second outer electrode 35 and the inner electrode 20 as electrodes and a portion of the carrier element 12 as a dielectric. The two sensing capacitors, one with the first outer electrode, the other one with the second outer electrode 35, can be operated in parallel. Their output signals can be used to generate a differential output signal. In combination with a differential input amplifier, this system is likely to produce less common-mode effects. It is less sensitive to hum loops and ground potential differences between the sensor and a signal amplifier which processes the output signal of the sensor 4. Advantageously, the geometric sizes of the respective two outer electrodes 34, 35 are different, so that the first outer electrode 34 and the second outer electrode 35 are on different voltages for a given voltage of the inner conductor 245. The voltage difference between the outer electrodes 34, 35 relates to the voltage of the inner conductor 245. Following an appropriate calibration, the voltage difference can be used to determine the voltage of the inner conductor 245.

The carrier element 12 and the inner electrode 20 and the first outer electrode 34 are similar to the corresponding elements in the sensors 1, 2, 3 previously described. The outer electrodes 34, 35, cover only about one half of the surface of the carrier element 12 and leave axial sections at both ends of the carrier element 12 uncovered. The inner electrode 20, however, extends axially up to the edges of the carrier element. This extension up to the edges reduces electrical stress between the inner conductor 245 of the cable 240 and the carrier element 12, because the inner electrode 20 provides that no electric field exists in the gap 260, i.e. between the inner electrode 20 and the inner conductor 245. Due to the tubular shape of the sensor 4, the length of the geometrically shortest path 90 between the inner electrode edge 140 and the outer electrode edge 150 along the surface of the carrier element 12 is 35 millimeters. The radial distance between the electrodes 20, 30 is 10 millimeters.

FIG. 9 is a schematic longitudinal section of a cable accessory comprising the sensor 2 shown in FIG. 5. The cable accessory is a splice device 500, which protects the end portions of two medium- or high-voltage cables (not shown) that are connected with each other via a cable connector 231. The outer diameter of the splice device 500 is approximately 100 millimeters, its axial extension is about 250 millimeters. The splice device 500 comprises a voltage sensing device 2 as shown in FIG. 2. The voltage sensing device 2 is arranged inside the splice device 500.

The voltage sensor 2 receives in its passageway 40 a cable connector 231, which is similar to the connector 230 of FIG. 5, except that it has receptacles 510, 511 on both of its end portions which can receive a respective cable adapter 250. One such cable adapter 251 is shown in dotted lines. The connector 231 is a self-mating connector: A cable adapter 251 that is inserted into one of the receptacles 510, 511 is mated and secured solely by the action of pushing the cable adapter 250 deep enough into the receptacle 510, 511. No screws are required to secure a cable adapter 251 to the connector 231. Similar to the embodiment shown in FIG. 5, a plurality of lamellae 300 provide electrical contact between the conductive connector 231 and the inner electrode 20 of the sensor 2.

The outer electrode 31 of the sensor 2 is connected to a printed circuit board (PCB, not shown) via a sensor wire 490, so that the voltage of the outer electrode 31 is available on the PCB. The PCB is located outside the splice device 500.

The splice device 500 is of a generally cylindrical shape. It comprises a splice body 520 and a conductive envelope 530 The splice body 520 comprises a shrinkable, electrically isolating silicone material, which has been molded around the sensor 2 and the connector 231 after the sensor 2 and the connector 231 were assembled. The silicone material was selected for good adhesion to the surface of the carrier element 11. An intimate contact between the silicone material and the surface of the carrier element 11 helps in avoiding air gaps close to the surface of the carrier element 11. Such air gaps, in turn, can increase the risk of a surface breakdown between the inner electrode 20 and the outer electrode 31. When in its liquid state, the silicone material flows around the sensor 2, the connector 231 and the lamellae 300. The sensor 2 and the connector 231 are thereby embedded in the splice body 520.

The splice body 520 comprises openings 540, 541 at its axial end portions. These openings 540, 541 leave the receptacles 510, 511 of the connector 231 accessible from an axial direction, so that a cable adapter 251 can be inserted through an opening 540, 541 into the respective receptacle 510, 511 for mating with the connector 231. By mating, the cable adapter 251 and the cable attached to it are secured to the connector 231. After mating, the splice body 520 can be shrunk down around the cable adapter 251 and a portion of the cable, so that a sealing effect is achieved. Tubular inserts 550 hold the openings 540, 541 shrinkable splice body 520 in a radially expanded state. For clarity, only the tubular insert 550 on the left-hand side of the drawing is shown. An identical tubular insert 550 holds the opening 541 on the right-hand side of the drawing in a radially expanded state. Once a cable adapter 251 is mated with the cable connector 231, the tubular insert 550 on that side of the connector 231 can be removed, so that the splice body 520 shrinks down radially around the cable adapter 251 and a portion of the cable.

The conductive envelope 530 forms an electrically conductive layer on the outer surface of the splice body 520. The conductive envelope 530 comprises an electrically conductive or semiconductive silicone, which is elastic and shrinkable. The envelope 530 surrounds the splice body 520 completely, except for a wire opening 560 to let the sensor wire pass through, and except for the openings 540, 541 that permit access to the cable connector 231 before the splice body is shrunk down. The conductive envelope 530 shields the sensor 2 from electrical fields outside of the splice device 500, which allows for a more accurate sensing of the voltage of the connector 231 and thereby of the voltage of the inner conductor of the cable connected to the connector 231.

FIG. 9 is a simplified drawing of the splice device 500. Some elements, that are not essential for the present invention, are not shown. For example, conductive or semiconductive stress control elements of the splice device 500 are not shown.

FIG. 10 is a circuit diagram of an electrical circuit that can be used with voltage sensing devices described above instead of the circuit shown in FIG. 7. The inner electrode 20, the outer electrode 30, 31, the sensing capacitor 800 (or high-voltage capacitor) and the secondary capacitor 810 (or low-voltage capacitor) forming the voltage divider are identical to the corresponding elements in FIG. 7 and will thus not be explained again. In the circuit shown in FIG. 10, an operational amplifier ("OpAmp") 900 is used to sense the voltage of the cable connector 230 and of the inner conductor 245 via the capacitive voltage divider formed by sensing capacitor 800 and the secondary capacitor 810. Specifically, the OpAmp is a so-called transimpedance amplifier. For that purpose of precise voltage sensing, the positive input of the OpAmp 900 is electrically connected to the second electrode 30, 31 of the sensing capacitor 800. The negative input of the OpAmp 900 is electrically connected to ground via a ground resistor 905. Power supply and control elements of the OpAmp 900 are not shown. A feedback resistor 910 is electrically arranged between the output of the OpAmp 900 and its negative input. It provides for stable amplification of the voltage difference between the inputs of the OpAmp 900. The output of the OpAmp 900 is a voltage, which is proportional to the voltage on the second electrode 30, 31 of the sensing capacitor 800 and thereby proportional to the voltage of the cable connector 230 and of the inner conductor 245 over electrical ground. The output voltage of the OpAmp 900 is measured via a measurement resistor 920 and voltage measurement device 930.

Resistance values for the measurement resistor 920, for the ground resistor 905 and for the feedback resistor 910 are in the order of 1 Megohm (MΩ) each.

For a given voltage of the cable connector 230, the accuracy of the output voltage of the OpAmp 900 in the circuit shown in FIG. 10 depends on the respective electrical tolerances of the sensing capacitor 800, the secondary capacitor 810, the feedback resistor 910 and of the grounding resistor 905. Tolerances for commercially available capacitors are typically not better than 1%, while for commercially available resistors they are typically as low as 0.1% or 0.05%.

In order to achieve an even higher accuracy in determination of the voltage of the cable connector 230 over ground, the circuit shown in FIG. 10 can be modified such that the secondary capacitor 810 of the circuit is no longer necessary. The accuracy of the voltage sensing may thereby increase, because capacitors are only available with comparatively large tolerances of typically 1%. This large tolerance limits the accuracy with which the voltage of the cable connector 230 can be sensed.

FIG. 11 is a circuit diagram of such a circuit without the secondary capacitor 810. The first sensing electrode 20 of the sensing capacitor 800 is electrically connected to the high voltage of connector 230. The second sensing electrode 30, 31 is electrically connected to the negative input of an OpAmp 901. The positive input of the OpAmp 901 is on electrical ground. A feedback resistor 911 is electrically arranged between the output of the OpAmp 901 and its negative input. It provides for stable amplification of the voltage difference between the inputs of the OpAmp 901. The output voltage of the OpAmp 901 is measured via a measurement resistor 921 and voltage measurement device 931.

For a given voltage of the cable connector 230, the accuracy of the output voltage of the OpAmp 901 in the circuit shown in FIG. 11 depends on the respective electrical tolerances of the sensing capacitor 800, and of the feedback resistor 910. Compared to the circuit shown in FIG. 10, there are two elements less, the tolerance of which may reduce the accuracy, namely the secondary capacitor and the grounding resistor. Hence in certain scenarios the circuit shown in FIG. 11 may allow for a higher accuracy in sensing the voltage on the connector 230 and on the inner conductor 245 than the circuit shown in FIG. 10.

It is noted that in the circuits shown in FIGS. 10 and 11, integration and inverting of the output signal of the OpAmps 900, 901 may be necessary. This can be achieved by components like a microcontroller, which are not shown in the Figures, without a loss of accuracy.

The invention claimed is:

1. A voltage sensing device for a high-voltage or medium-voltage power-carrying conductor for a power network, wherein the power carrying conductor comprises an inner conductor of one of a power cable, a cable connector, and a bus bar, the voltage sensing device having a tubular shape and an axial passageway defining at least a first axial direction and at least a first radial direction, which passageway is configured to receive the power-carrying conductor, the voltage sensing device comprising
a) a radially-inner electrode, operable as a first sensing electrode of a sensing capacitor for sensing the voltage of the power-carrying conductor,
b) a radially-outer electrode, operable as a second sensing electrode of the sensing capacitor,
c) a solid carrier element, at least a first portion of which is arranged between the inner electrode and the outer electrode, the first portion comprising a ceramic material being operable as a dielectric of the sensing capacitor, wherein the radially-inner electrode extends in the first axial direction up to an inner electrode edge, wherein the radially-outer electrode extends in the first axial direction up to an outer electrode edge, and
wherein the carrier element is shaped such that the geometrically shortest path along a surface of the carrier element between the outer electrode edge and the inner electrode edge has a length of at least 3 millimeters.

2. Voltage sensing device according to claim 1, wherein the passageway defines a central axis, and wherein the greatest radial distance of the outer electrode from the central axis at any axial location is less than 50 millimeters.

3. Voltage sensing device according to claim 1, wherein radial distance between the inner and the outer electrode, measured in one radial direction at any axial position, is 54 millimeters or less.

4. Voltage sensing device according to claim 1, wherein the carrier element comprises, in at least one axial longitudinal sectional view, a protrusion.

5. Voltage sensing device according to claim 1, wherein the outer electrode has a curved profile, in an axial longitudinal sectional view of the voltage sensing device, such that a central portion of the outer electrode is radially closer to a central axis of the passageway than the outer electrode edge is.

6. Voltage sensing device according to claim 1, wherein the ceramic material has a coefficient of thermal expansion of less than $5 \times 10^{-6}$ 1/K at 20° C.

7. Voltage sensing device according to claim 1, wherein the voltage sensing device comprises a conductive contact element, electrically connected to the inner or to the outer electrode, for mechanically and electrically contacting a power-carrying conductor received in the passageway.

8. Voltage sensing device according to claim 1, wherein the ceramic material comprises one or more material(s) selected from porcelain, mica, silicon nitride, and "IEC/EN 60384 class 1" dielectrics including $MgNb_2O_6$, $ZnNb_2O_6$, $MgTa_2O_6$, $ZnTa_2O_6$, $(Zn, Mg)TiO_3$, $(ZrSn)TiO_4$, $CaZrO_3$, $Ba_2n_9O_{20}$.

9. Cable connector according to claim 8, wherein the contact element comprises a resilient portion.

10. Voltage sensing device according to claim 1, wherein the ceramic material comprises a ceramic filler disposed in a polymer matrix.

11. Voltage sensing device according to claim 1, wherein the carrier element comprises a first ceramic material having a positive temperature coefficient of capacitance and a second ceramic material having a negative temperature coefficient of capacitance.

12. Cable connector for mating with one of a cable adapter and an inner conductor of a medium-voltage or high-voltage power cable, the cable connector comprising a conductive contact element, adapted to electrically connect the cable connector to one of the inner and the outer electrode of a voltage sensing device according to claim 1, when a portion of the cable connector is received in at least a portion of the passageway.

13. Combination of a voltage sensing device according to claim 1 with a high-voltage or medium-voltage power-carrying conductor for a power network, wherein the passageway receives at least a portion of the power-carrying conductor.

14. Combination of a voltage sensing device according to claim 1 with a cable connector, wherein the cable connector is adapted to mate with one of a cable adapter and an inner conductor of a power cable, wherein the passageway receives at least a portion of the cable connector.

15. Cable accessory for use with a high-voltage or medium-voltage power cable for a power network, the cable accessory comprising a voltage sensing device according to claim 1.

16. The cable accessory according to claim 15, wherein the cable accessory comprises one of a splice device, a termination, and a separable connector.

17. Method of arranging a voltage sensing device according to claim 1 on a power-carrying conductor for a power network, wherein the power-carrying conductor comprises one of a cable connector and an inner conductor of at least one of a medium-voltage or high-voltage power cable and a bus bar, the method comprising, in this sequence, the steps of
 a) providing the voltage sensing device according to claim 1, and providing the power-carrying conductor, the power-carrying conductor being adapted such that at least a portion of the power-carrying conductor is receivable in at least a portion of the passageway;
 b) moving the voltage sensing device and the power-carrying conductor relative to each other such that at least a portion of the passageway receives at least a portion of the power-carrying conductor.

\* \* \* \* \*

UNITED STATES PATENT AND TRADEMARK OFFICE
CERTIFICATE OF CORRECTION

PATENT NO. : 10,215,778 B2
APPLICATION NO. : 15/106591
DATED : February 26, 2019
INVENTOR(S) : Gravermann et al.

Page 1 of 1

It is certified that error appears in the above-identified patent and that said Letters Patent is hereby corrected as shown below:

In the Claims

Column 24,
Line 32, delete "$Ba_2n_9O_{20}$" and insert in place thereof -- $Ba_2Ti_9O_{20}$ --.

Signed and Sealed this
First Day of October, 2019

Andrei Iancu
*Director of the United States Patent and Trademark Office*